United States Patent
Lee

(10) Patent No.: US 11,005,059 B2
(45) Date of Patent: May 11, 2021

(54) ORGANIC LIGHT EMITTING DISPLAY DEVICE

(71) Applicant: LG Display Co., Ltd., Seoul (KR)

(72) Inventor: HeuiDong Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 26 days.

(21) Appl. No.: 15/209,712

(22) Filed: Jul. 13, 2016

(65) Prior Publication Data
US 2017/0179418 A1 Jun. 22, 2017

(30) Foreign Application Priority Data
Dec. 17, 2015 (KR) .................. 10-2015-0181250

(51) Int. Cl.
*H01L 51/50* (2006.01)
*H01L 27/32* (2006.01)
*H01L 51/52* (2006.01)

(52) U.S. Cl.
CPC ...... *H01L 51/5016* (2013.01); *H01L 27/3246* (2013.01); *H01L 27/3248* (2013.01); *H01L 51/5004* (2013.01); *H01L 51/5024* (2013.01); *H01L 51/5056* (2013.01); *H01L 51/5072* (2013.01); *H01L 51/5218* (2013.01); *H01L 51/5234* (2013.01); *H01L 51/5237* (2013.01); *H01L 27/3211* (2013.01); *H01L 51/506* (2013.01); *H01L 51/5064* (2013.01);
(Continued)

(58) Field of Classification Search
CPC ............ H01L 51/5004; H01L 51/5016; H01L 51/5024
See application file for complete search history.

(56) References Cited

U.S. PATENT DOCUMENTS

2003/0044639 A1* 3/2003 Fukuda ............... H01L 27/3211
428/690
2004/0091738 A1* 5/2004 Psai .................... C07F 15/0033
428/690
(Continued)

FOREIGN PATENT DOCUMENTS

CN 101952990 A 1/2011
CN 102683615 A 9/2012
(Continued)

OTHER PUBLICATIONS

China National Intellectual Property Administration, Office Action, CN Patent Application No. 201610515695.6, dated Oct. 9, 2019, 21 pages.
(Continued)

*Primary Examiner* — Lex H Malsawma
*Assistant Examiner* — Geoffrey H Ida
(74) *Attorney, Agent, or Firm* — Fenwick & West LLP

(57) ABSTRACT

Disclosed is an organic light emitting display device. The organic light emitting display device includes a first electrode on the first pixel and the second pixel, a hole transport layer on the first electrode, a first emission layer on the hole transport layer in correspondence with the first pixel, a second emission layer on the hole transport layer in correspondence with the second pixel, an exciton confinement layer on the first emission layer and the second emission layer, and a second electrode on the exciton confinement layer. The second emission layer includes a mixed host and an electron-type host.

30 Claims, 6 Drawing Sheets

(52) U.S. Cl.
CPC ...... *H01L 51/5096* (2013.01); *H01L 51/5265* (2013.01); *H01L 51/5278* (2013.01); *H01L 2251/5384* (2013.01); *H01L 2251/552* (2013.01)

(56) References Cited

U.S. PATENT DOCUMENTS

| | | | |
|---|---|---|---|
| 2004/0262576 A1 | 12/2004 | Thompson et al. | |
| 2007/0092757 A1* | 4/2007 | Liu | H01L 51/5016 428/690 |
| 2008/0074038 A1 | 3/2008 | Kim et al. | |
| 2008/0111474 A1* | 5/2008 | Sung | H01L 27/322 313/504 |
| 2011/0073844 A1 | 3/2011 | Pieh et al. | |
| 2011/0215301 A1 | 9/2011 | Forrest | |
| 2011/0303903 A1* | 12/2011 | Yoshinaga | H01L 51/0056 257/40 |
| 2012/0235127 A1 | 9/2012 | Takasu et al. | |
| 2013/0207082 A1* | 8/2013 | Cho | H01L 51/5016 257/40 |
| 2014/0042469 A1 | 2/2014 | Seo et al. | |
| 2014/0124766 A1* | 5/2014 | Song | H01L 51/5004 257/40 |
| 2014/0131674 A1* | 5/2014 | Park | H01L 27/3209 257/40 |
| 2014/0340888 A1 | 11/2014 | Ishisone et al. | |
| 2016/0365389 A1 | 12/2016 | Gao et al. | |

FOREIGN PATENT DOCUMENTS

| | | |
|---|---|---|
| CN | 104253146 | 12/2014 |
| EP | 1944809 | 7/2008 |
| KR | 20110035048 | 4/2011 |
| WO | WO2009070382 | 6/2009 |

OTHER PUBLICATIONS

China National Intellectual Property Administration, Office Action, CN Patent Application No. 201610515695.6, dated Oct. 21, 2020, 17 pages.

Yu, J., et al., "OLED Display Base and Industrialization," University of Electronic Science and Technology Press, Feb. 2015, pp. 35-38.

* cited by examiner

ORGANIC LIGHT EMITTING DISPLAY DEVICE

CROSS-REFERENCE TO RELATED APPLICATIONS

This application claims the benefit of Republic of Korea Patent Application No. 10-2015-0181250 filed on Dec. 17, 2015, which is hereby incorporated by reference as if fully set forth herein.

BACKGROUND

Field

The present disclosure relates to an organic light emitting display device, and more particularly, to an organic light emitting display device with enhanced efficiency or lifetime.

Discussion of the Related Art

As society advances to be more of an information-oriented society, the field of display devices which visually express information is rapidly advancing. Various display devices, having excellent performance in terms of thinness, lightness, and low power consumption, are being correspondingly developed.

Examples of the display devices include liquid crystal display (LCD) devices, plasma display panel (PDP) devices, field emission display (FED) devices, organic light emitting display devices, etc.

Particularly, the organic light emitting display devices are self-emitting devices. In comparison with other display devices, the organic light emitting display devices have a fast response time, high emission efficiency, high luminance, and a wide viewing angle and thus are attracting much attention.

SUMMARY

Accordingly, the present disclosure is directed to provide an organic light emitting display device that substantially obviates one or more problems due to limitations and disadvantages of the related art.

Organic light emitting display devices each include an organic emission layer which is formed between two electrodes. An electron and a hole are injected from the two electrodes into the organic emission layer, and an exciton is generated by combining the electron with the hole. The organic light emitting display devices are devices based on the principle that light is emitted when the generated exciton is dropped from an excited state to a ground state.

In top emission type organic light emitting devices, since a green subpixel among a plurality of subpixels requires the highest luminance ratio, it is important to increase the emission efficiency of a green emission layer in configuring red, green, and blue subpixels. Therefore, research is being done for applying a green phosphorescence host material, having emission efficiency higher than that of a general green fluorescence host material, to a green emission layer.

Moreover, a method of manufacturing an organic light emitting device includes a thermal evaporation process. The thermal evaporation process is a process where each functional layer and organic emission layer necessary for the organic light emitting device are formed by selectively forming a plurality of organic layers with a fine metal mask. Among organic light emitting devices manufactured by the fine metal mask process, an organic light emitting device including a green emission layer including a green phosphorescence host material, is high in efficiency but is shorter in lifetime than a general organic light emitting device including a green emission layer including a green fluorescence host material.

Therefore, the inventor recognizes the above-described problems and has executed various experiments for improving lifetime of an organic light emitting display device. Through the various experiments, the inventor has invented an organic light emitting display device in which lifetime is enhanced by improving characteristics of hosts included in a green phosphorescence emission layer for enhancing lifetime of the organic light emitting display device.

An aspect of the present disclosure is directed to providing an organic light emitting display device in which efficiency or lifetime is enhanced by improving characteristics of hosts included in a green phosphorescence emission layer.

Another aspect of the present disclosure is directed to providing an organic light emitting display device in which three or more hosts are applied to a green phosphorescence emission layer, and in which an exciton confinement layer is disposed adjacent to a green emission layer, thereby enhancing efficiency or lifetime.

The objectives of the present disclosure are not limited to the aforesaid, but other objectives not described herein will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

According to one embodiment, there is provided an organic light emitting display device including a first pixel and a second pixel. The organic light emitting display device includes a first electrode on the first pixel and the second pixel, a hole transport layer on the first electrode, a first emission layer on the hole transport layer in correspondence with the first pixel, a second emission layer on the hole transport layer in correspondence with the second pixel, the second emission layer including a mixed host and an electron-type host, an exciton confinement layer on the first emission layer and the second emission layer, and a second electrode on the exciton confinement layer.

In another aspect of the present disclosure, there is provided an organic light emitting display device, including at least one hole transport layer, at least one emission layer, and at least one electron transport layer between an anode and a cathode, which includes an exciton confinement layer on the at least one emission layer, wherein the at least one emission layer includes a first host and an electron-type host, and when a triplet energy level of the exciton confinement layer is ECL(T1), a triplet energy level of the first host is W(T1), and a triplet energy level of the electron-type host is E(T1), ECL(T1)>W(T1)>E(T1) is satisfied.

In another aspect of the present disclosure, there is provided an organic light emitting display device that includes a hole transport layer on an anode and an emission layer on the hole transport layer, the emission layer including a hole-type host, an electron-type host, and a first host having a triplet energy level between a triplet energy level of the hole-type host and a triplet energy level of the electron-type host, wherein the hole-type host, the first host, and the electron-type host constitute an exciplex.

Details of embodiments are included in a detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION OF THE ILLUSTRATED EMBODIMENTS

Figure 1:
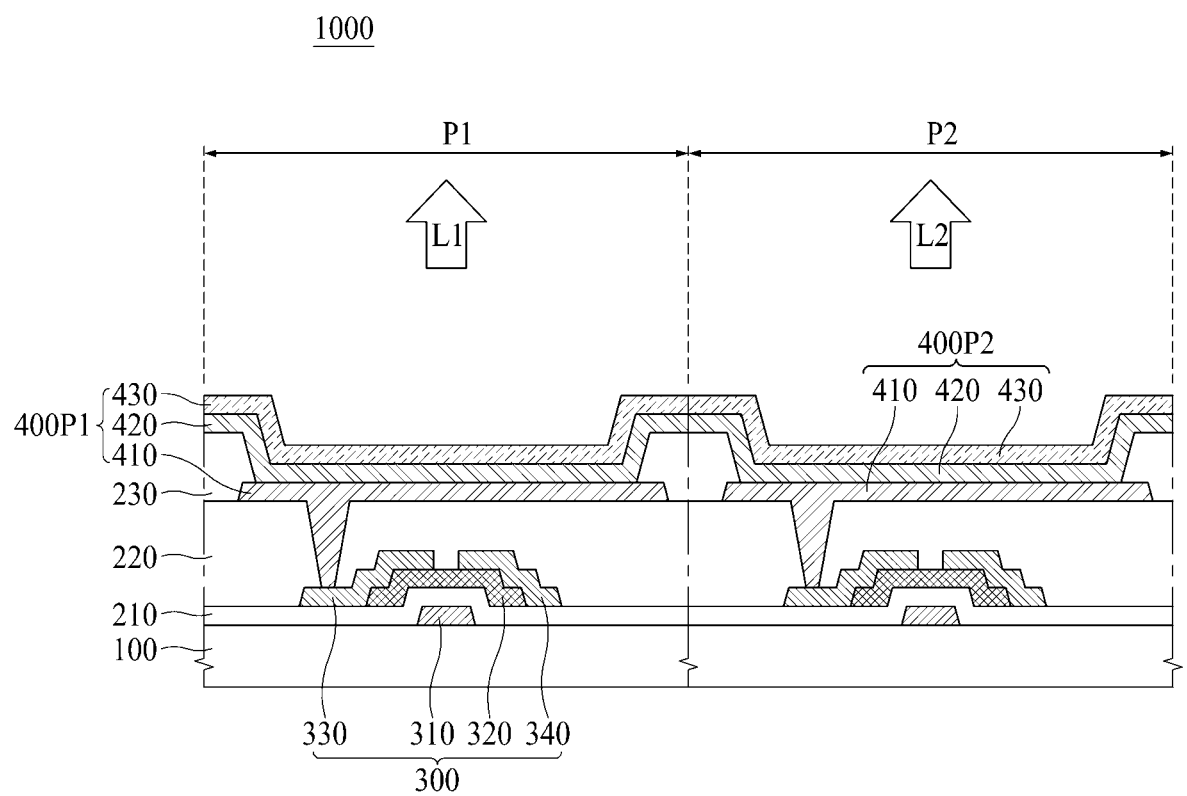
FIG. 1 is a diagram illustrating an organic light emitting display device according to first to third embodiments of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a diagram illustrating an organic light emitting display device according to first to third embodiments of the present disclosure.

Referring to FIG. 1, an organic light emitting display device 1000 may include a substrate 100, a thin film transistor (TFT) 300, and a plurality of light emitting devices 400P1 and 400P2. The organic light emitting display device 1000 may include a plurality of pixels P. A pixel P denotes an area corresponding to a minimum unit where light is actually emitted, and may be referred to as a subpixel or a pixel area. Also, a certain plurality of pixels P may constitute a minimum group for realizing white light. For example, three pixels may constitute one group, namely, a red pixel, a green pixel, and a blue pixel may constitute one group. Alternatively, four pixels may constitute one group, namely, a red pixel, a green pixel, a blue pixel, and a white pixel may constitute one group. However, the present embodiment is not limited thereto, and various pixel designs may be made. In FIG. 1, for convenience of description, only two adjacent pixels P1 and P2 that respectively emit light L1 having a first color and light L2 having a second color are illustrated.

As illustrated in FIG. 1, the organic light emitting display device 1000 may include the TFT 300 and the plurality of light emitting devices 400P1 and 400P2, which are provided in each of a plurality of pixels. The TFT 300 may be disposed on the substrate 100 and may supply a signal to the plurality of light emitting devices 400P1 and 400P2. The TFT 300 illustrated in FIG. 1 may be a driving TFT connected to a first electrode 410 of each of the light emitting devices 400P1 and 400P2. Each of the pixels P1 and P2 may further include a switching TFT or a capacitor for driving the plurality of light emitting devices 400P1 and 400P2.

The substrate 100 may be formed of an insulating material or a material having flexibility. The substrate 100 may be formed of glass, metal, plastic, and/or the like, but is not limited thereto. If an organic light emitting display device is a flexible organic light emitting display device, the substrate 100 may be formed of a flexible material such as plastic and/or the like. Also, if an organic light emitting device which has high flexibility is applied as a lighting device for vehicles, various designs and degree of freedom in design for the lighting device for vehicles can be secured according to a structure or an appearance of the vehicle.

The TFT 300 may include a gate electrode 310, an active layer 320, a source electrode 330, and a drain electrode 340. Referring to FIG. 1, the gate electrode 310 may be formed on the substrate 100, and a gate insulation layer 210 may cover the gate electrode 310. The active layer 320 may be disposed on the gate insulation layer 210, and the source electrode 330 and the drain electrode 340 may be disposed on the active layer 320 to be spaced apart from each other.

In the present specification, two objects overlapping each other may denote that at least a portion of one of the two objects overlaps at least a portion of the other of the two objects irrespective of whether another object is located between the two objects, in a vertical relationship between the two objects and may be referred to as other various names.

The gate electrode 310, the source electrode 330, and the drain electrode 340 may each be formed of a conductive material. The gate electrode 310, the source electrode 330, and the drain electrode 340 may each be formed of one among molybdenum (Mo), aluminum (Al), chromium (Cr), gold (Au), titanium (Ti), nickel (Ni), neodymium (Nd), and copper (Cu) or an alloy thereof, but are not limited thereto. In other embodiments, the gate electrode 310, the source electrode 330, and the drain electrode 340 may each be formed of various materials.

The active layer 320 may be formed of one among amorphous silicon (a-Si), polycrystalline silicon (poly-Si), oxide, and organic materials depending on the kinds, but is not limited thereto.

The gate insulation layer 210 may be formed of a single layer or a multi-layer which is formed of an inorganic material, and may be formed of silicon oxide (SiOx), silicon nitride (SiNx), and/or the like. However, the present embodiment is not limited thereto.

Also, in FIG. 1, the TFT 300 is illustrated as having an inverted staggered structure, but is not limited thereto. In other embodiments, the TFT 300 may be formed in a coplanar structure.

A planarization layer 220 exposing a portion of the source electrode 330 may be disposed on the TFT 300. The planarization layer 220 may be formed of a single layer or a multi-layer and may be formed of an organic material. The planarization layer 220 may be formed of polyimide, acryl, and/or the like, but is not limited thereto.

A passivation layer may be further formed between the planarization layer 220 and the TFT 300. The passivation layer may be formed of an inorganic material. The passivation layer may protect the TFT 300 and may expose a portion of the source electrode 300 similarly to the planarization layer 220.

A bank 230 may divide the pixels P1 and P2. Also, the bank 230 may be formed of an organic material, and for example, may be formed of one among polyimide and photoacryl, but is not limited thereto.

The light emitting devices 400P1 and 400P2 may be disposed on the planarization layer 220 and may include a first electrode 410, an emission part 420, and a second electrode 430. The organic light emitting display device 1000 according to an embodiment of the present disclosure may be a top emission type, and in this case, light emitted from the emission part 420 may be output in an upward direction through the second electrode 430. Also, as illustrated in FIG. 1, a first light emitting device 400P1 of the organic light emitting display device 1000 may be disposed in a first pixel P1, and a second light emitting device 400P2 may be disposed in a second pixel P2. The first pixel P1 may be a pixel emitting the light L1 having the first color, and the second pixel P2 may be a pixel emitting the light L2 having the second color. The light L1 having the first color and the light L2 having the second color may be different colors.

A detailed structure of a light emitting device disposed in each of the two adjacent pixels P1 and P2 will be described below with reference to FIG. 2.

Figure 2:
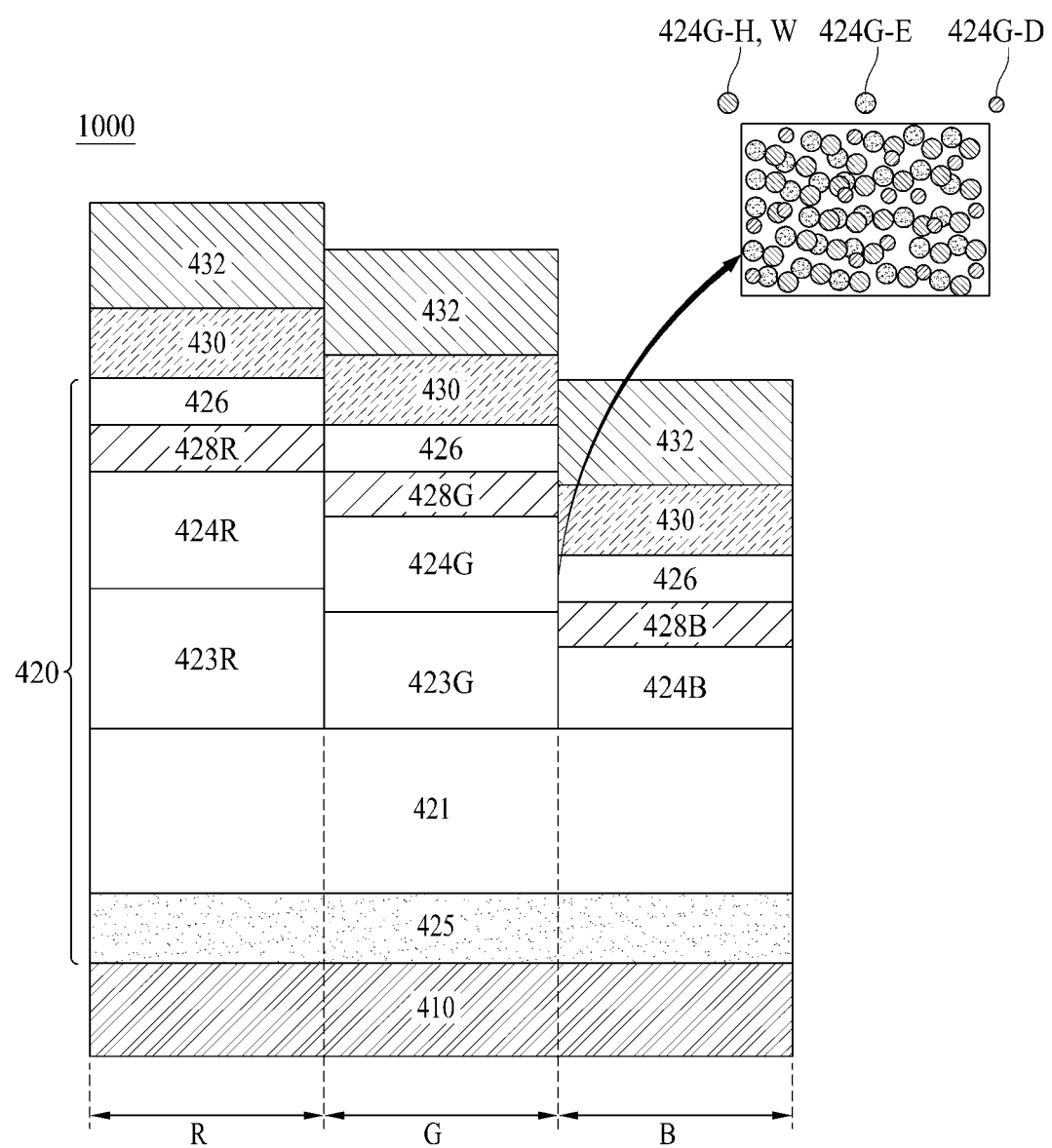
FIG. 2 is a diagram illustrating elements of the organic light emitting display device according to the first embodiment of the present disclosure.

FIG. 2 is a diagram illustrating elements of the organic light emitting display device 1000 according to the first embodiment of the present disclosure. In more detail, FIG. 2 is a cross-sectional view for describing elements of three light emitting devices respectively disposed in a plurality of pixels R, G and B included in the organic light emitting display device 1000. Also, FIG. 2 illustrates elements of the organic light emitting display device 1000, and a thickness of each of the elements does not limit details of the present disclosure.

The organic light emitting display device 1000 may include a plurality of adjacent pixels R, G, and B. In more detail, the organic light emitting display device 1000 may include a red pixel R, a green pixel G, and a blue pixel B. The three pixels R, G, and B may constitute a minimum of group for realizing white light. In the organic light emitting display device 1000, the three pixels R, G, and B may be repeatedly arranged to display an image.

Referring to FIG. 2, a red light emitting device may be disposed in the red pixel R. The red light emitting device may include an emission part 420 that includes a P-type hole transport layer (HTL) 425, a first HTL 421, a second HTL 423R, a red emission layer (EML) 424R, an exciton confinement layer (ECL) 428R, and an electron transport layer (ETL) 426.

A green light emitting device may be disposed in the green pixel G. The green light emitting device may include an emission part 420 that includes a P-type HTL 425, a first HTL 421, a second HTL 423G, a green EML 424G, an ECL 428G, and an ETL 426.

A blue light emitting device may be disposed in the blue pixel B. The blue light emitting device may include an emission part 420 that includes a P-type HTL 425, a first HTL 421, a blue EML 424B, an ECL 428B, and an ETL 426.

The first electrode 410 may be an electrode that supplies a hole to the emission part 420, and may be referred to as an anode.

The first electrode 410 may be connected to the drain electrode 340 depending on the kind of the TFT 300. Also, since the organic light emitting display device 1000 according to the present embodiment is a top emission type, the first electrode 410 may include a reflective layer. For example, the first electrode 410 may have a two-layer structure where a transparent layer and a reflective layer are sequentially stacked, or may have a three-layer structure where a transparent layer, a reflective layer, and a transparent layer are sequentially stacked. The transparent layer may be formed of, for example, transparent conductive oxide (TCO) such as indium tin oxide (ITO), indium zinc oxide (IZO), or the like. The reflective layer may be formed of, for example, copper (Cu), silver (Ag), palladium (Pd), and/or the like. Therefore, the first electrode 410 may be formed of gold (Au), silver (Ag), aluminum (Al), molybdenum (Mo), magnesium (Mg), lithium (Li), calcium (Ca), lithium fluoride (LiF), Mg;LiF, Ag;Mg, ITO, IZO, and/or the like, or may be formed of an alloy thereof. Alternatively, the first electrode 410 may be formed of a single layer or a multi-layer. Also, the first electrode 410 may be referred to as a reflective electrode.

The second electrode 430 may be disposed in each of the plurality of pixels R, G, and B in common and may be an electrode that supplies an electron to the emission part 420. The second electrode 430 may be referred to as a cathode or a common electrode. Since light emitted from the emission part 420 should pass through the second electrode 430, the second electrode 430 may be formed of a metal material or a transparent material having a thin thickness, for example, a thickness of 15 nm to 25 nm. The second electrode 430 may be formed of, for example, gold (Au), silver (Ag), aluminum (Al), molybdenum (Mo), magnesium (Mg), lithium (Li), calcium (Ca), lithium fluoride (LiF), Mg;LiF, Ag;Mg, ITO, IZO, and/or the like, may be formed of ITO, IZO, or indium gallium zinc oxide (IGZO) which is a transparent conductive material such as transparent conductive oxide (TCO), or may be formed of a single layer or a multi-layer thereof. However, the present embodiment is not limited thereto. Also, the second electrode 430 may be referred to as a semi-transparent electrode or a semi-transmissive electrode.

A capping layer 432 may be further formed on the second electrode 430, for protecting the organic light emitting device. The capping layer 432 may be omitted depending on the structure or characteristic of the organic light emitting device.

The P-type HTL 425 may be a HTL doped with a P-type dopant and may increase hole mobility to enable a hole supplied from the first electrode 410 to be smoothly injected into the emission part 420. The P-type HTL 425 may be formed by adding a P-type dopant into a material constituting the first HTL 421, and thus, the P-type HTL 425 and the first HTL 421 may be formed through a continuous process using one piece of process equipment.

The first HTL 421 may be disposed on the first electrode 410 in each of the pixels R, G, and B. The first HTL 421 may smoothly transfer a hole, injected from the first electrode 410, to the red EML 424R, the green EML 424G, or the blue EML 424B. The first HTL 421 may be formed of one or more of N,N'-bis(naphthalene-1-yl)-N,N'-bis(phenyl)-2,2'-dimethylbenzidine (NPD), N, N'-bis(3-methylphenyl)-N,N'-bis(phenyl)-benzidine (TPD), 2,2',7,7'-tetrakis(N,N-diphenylamino)-9,9-spirobifluorene (Spiro-TAD), and 4,4',4''-tris(N-3-methylphenyl-N-phenylamino)triphenylamine (MTDATA), but is not limited thereto.

The P-type HTL 425 and the first HTL 421 may each be a layer having a common structure and may each extend to a top of the first electrode 410 in correspondence with the plurality of pixels R, G, and B. The first HTL 421 having the common structure may be formed by using a common mask where all pixels are exposed, and may be stacked in the same structure in all pixels R, G, and B without a pattern for each of the plurality of pixels R, G, and B. That is, the first HTL 421 may be disposed to connect or extend from one pixel to an adjacent pixel without being disconnected and may be shared across a plurality of pixels. The P-type HTL 425 and the first HTL 421 may be referred to as a common layer or a common-structure layer.

The light emitting device may be configured with the emission part 420 where different stacked structures are provided in the pixels R, G, and B, based on characteristics (for example, the wavelength or material of emitted light) of the EMLs 424R, 424G, and 424B respectively disposed in the pixels R, G, and B. In more detail, the emission part 420 of the red light emitting device may have a structure and a thickness based on a micro-cavity distance between the first electrode 410 and the second electrode 430 depending on the wavelength of light emitted from the red EML 424R. The micro-cavity distance denotes that the light emitted from the red EML 424R is amplified through repeated reflection and re-reflection between two the electrodes 410 and 430 to cause constructive interference, and thus, emission efficiency is enhanced. Also, when the first electrode 410 is configured with a transparent layer including ITO, IZO, and/or the like and a reflective layer including a metal material, a distance from a top of the reflective layer to a bottom of the second electrode 430 may be the micro-cavity distance between the first electrode 410 and the second electrode 430.

In more detail, the emission part 420 of the red light emitting device may further include the second HTL 423R between the first HTL 421 and the red EML 424R, for optimizing the micro-cavity distance between the first electrode 410 and the second electrode 430. The second HTL 423R may optimize a micro-cavity distance of the red light emitting device and may smoothly transfer the hole, injected from the first electrode 410, to the red EML 424R. Likewise, the emission part 420 of the green light emitting device may further include the second HTL 423G for optimizing a micro-cavity distance of the green light emitting device.

The micro-cavity distance may have a thickness which is proportional to the wavelength of the light emitted from each of the EMLs 424R, 424G, and 424B. Therefore, as illustrated in FIG. 2, a thickness of the second HTL 423R of the red light emitting device may be adjusted thicker than that of the second HTL 423G of the green light emitting device, thereby optimizing a micro-cavity distance of the red light emitting device and the green light emitting device.

The blue light emitting device may further include a second HTL for adjusting a micro-cavity distance, based on a design of the light emitting device. The second HTL of the blue light emitting device may have a thickness corresponding to a range which is not thicker than a thickness of the emission part 420 of the red light emitting device or a thickness of the emission part 420 of the green light emitting device, and thus, a micro-cavity distance of each of three the light emitting devices may be optimized.

The second HTLs 423R and 423G may optimize a micro-cavity distance of the three light emitting devices and moreover may smoothly transfer the hole, injected from the first electrode 410 of the light emitting device, to the EMLs 424R, 424G, and 424B. The second HTLs 423R and 423G may each be formed of, for example, N,N-bis(3-methylphenyl)-N,N-bis(phenyl)-benzidine (TPD), N,N-bis(naphthalen-1-yl)-N,N-bis(phenyl)-benzidine (NPB), and/or the like, but is not limited thereto. The second HTLs 423R and 423G may each be referred to as a patterned layer or a patterned-structure layer. However, the second HTLs 423R and 423G may not be provided depending on a design of the light emitting device.

An electron blocking layer (EBL) may be further formed between the second HTLs 423R and 423G and the EMLs 424R and 424G and between the first HTL 421 and the EML 424B. The EBL prevents an electron from being transferred to the first HTL 421 to enable the hole and the electron to be smoothly recombined in the EMLs 424R, 424G, and 424B, thereby enhancing the emission efficiency of the organic light emitting display device.

The ETL 426 may smoothly transfer an electron, injected from the second electrode 430, to the EMLs 424R, 424G, and 424B. The ETL 426 may be a layer having the common structure and may extend to a top of each of the EMLs 424R, 424G, and 424B. The ETL 426 may be formed of, for example, one or more of tris(8-hydroxy-quinolinato)aluminum ($Alq_3$), 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), bis(2-methyl-8-quinolinolate)-4-(phenylphenolato)aluminum (BAlq), 8-hydrozyquinolinolato-lithium (Liq), and 2,2',2"-(1,3,5-benzinetriyl)-tris(1-phenyl-1-H-benzimidazole) (TPBi), but is not limited thereto.

An electron injection layer (EIL) may be further formed on the ETL 426. The EIL may be formed of, for example, one among tris(8-hydroxy-quinolinato)aluminum ($Alq_3$), 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), and bis(2-methyl-8-quinolinolate)-4-(phenylphenolato)aluminum (BAlq), but is not limited thereto.

The light emitting device of the organic light emitting display device 1000 according to the first embodiment of the present disclosure may have a patterned emission layer structure. In more detail, the EMLs 424R, 424G, and 424B disposed between the first HTL 421 and the second electrode 430 may have a patterned structure respectively provided in the pixels R, G, and B.

The red EML 424R corresponding to a red pixel R, the green EML 424G corresponding to a green pixel G, and the blue EML 424B corresponding to a blue pixel B may be EMLs emitting lights of different colors and may have a structure respectively provided in the pixels R, G, and B. Each of the EMLs 424R, 424G, and 424B may be pattern-deposited by using a mask (for example, a fine metal mask (FMM)) which is exposed for each pixel.

The red EML 424R of the red pixel R may be a layer emitting red light and may be formed of a material having a peak wavelength which is within a range of approximately 600 nm to 650 nm. The red EML 424R may include one or more host materials, and examples of the one or more host materials may include 4,4'-bis(carbozol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), Be complex, etc., but are not limited thereto. Also, a dopant constituting the red EML 424R may include a phosphorescent dopant, and examples of the phosphorescent dopant may include bis(2-benzo[b]thiophen-2-yl-pyridine)(acetylacetonate(iridium(III) (Ir(btp)$_2$(acac)), bis(1-phenylisoquinoline)(acetylacetonate)iridium(III) (Ir(piq)$_2$(acac)), tris(1-phenylquinoline)iridium(III) (Ir(piq)$_3$), 5,10,15,20-tetraphenyltetrabenzoporphyrin platinum complex (Pt (TPBP)), etc., but are not limited thereto. Also, the dopant constituting the red EML 424R may include a fluorescent dopant, and examples of the fluorescent dopant may include Perylene and the like, but are not limited thereto. The materials of the host or dopant constituting the red EML 424R do not limit details of the present disclosure.

The blue EML 424B of the blue pixel B may be a layer emitting blue light and may be formed of a material having a peak wavelength which is within a range of approximately 440 nm to 480 nm. The blue EML 424B may include one or more host materials, and examples of the one or more host materials may include 4,4'-bis(carbozol-9-yl)biphenyl (CBP), 1,3-bis(carbazol-9-yl)benzene (MCP), 9,10-di(naphth-2-yl)anthracene (ADN), anthracene derivatives, etc., but are not limited thereto. Also, a dopant constituting the blue EML 424B may be a phosphorescent dopant including a dopant material, and examples of the phosphorescent dopant may include bis(3,5-difluoro-2-(2-pyridyl)phenyl-(2-carboxypyridyl)iridium(III) (FlrPic), etc., but are not limited thereto. Also, the dopant constituting the blue EML 424B may be a fluorescent dopant, and examples of the fluorescent dopant may include polyfluorene (PFO)-based polymer, polyphenylenevinylene (PPV)-based polymer, pyren derivatives, etc., but are not limited thereto. The materials of the host or the dopant constituting the blue EML 424B do not limit details of the present disclosure.

The green EML 424G of the green pixel G may be a layer emitting green light and may be formed of a material having a peak wavelength which is within a range of approximately 510 nm to 590 nm.

Moreover, the green EML 424G may include at least three hosts and at least one dopant. The at least three hosts may include a hole-type host 424G-H, a first host 424G-W, and an electron-type host 424G-E. The hole-type host 424G-H, the first host 424G-W, and the electron-type host 424G-E may each be a phosphorescent host. The hole-type host 424G-H may include one among 4,4'-bis(carbozol-9-yl) biphenyl (CBP), 4,4',4"-tris(carbazol-9-yl)triphenylamine (TcTa), N,N'-bis(nathphalen-1-yl)-N,N'-bis(phenyl)-benzidine (NPB), etc., but is not limited thereto. The first host 424G-W may include one among 1,3-bis(carbazol-9-yl)benzene (MCP), N,N'-bis(naphthalene-1-yl)-N,N'-bis(phenyl)-2,2'-dimethylbenzidine (NPD), Be complex, anthracene derivatives, etc., but is not limited thereto. The electron-type host 424G-E may include one among 2,2',2"-(1,3,5-benzinetriyl)-tris(1-phenyl-1-H-benzimidazole) (TPBi), 4,6-bis(3,5-di(pyridine-3-yl)phenyl)-2-methylpyrimidine (B3PYMPM), 1,3-bis[3,5-di(pyridin-3-yl)phenyl]benzene (BmPyPhB), poly(p-phenylenevinylene) (PPV), bis(2-methyl-8-quinolinolate)-4-(phenylphenolato)aluminum (BAlq), etc., but is not limited thereto. Also, a dopant 424G-D included in the green EML 424G may include a phosphorescent dopant, and examples of the phosphorescent dopant may include tris(2-phenylpyridine)iridium(III) (Ir(ppy)$_3$), bis(2-phenylpyridine)(acetylacetonate)iridium(III) (Ir(ppy)$_2$(acac)), tris[2-(p-tolyl)pyridine]iridium(III) (Ir(m-ppy)$_3$), N,N'-diethylquinacridone (DEQ), 2,3,6,7-tetrahydro-1,1,7,7-tetramethyl-1H,5H,11H-10-(2-benzothiazolyl)quinolizino[9,9a,1gh]coumarin (C545T), etc., but are not limited thereto.

When a doping concentration of a dopant included in the green EML 424G increases, the dopant may act as a trap site in the green EML 424G, and for this reason, when the green EML 424G emits light, efficiency is reduced. Therefore, the phosphorescent dopant included in the green EML 424G may be doped at a concentration which is within a range of 3% to 20%, and for example, may be doped at a concentration which is within a range of 5% to 10%. Also, a thickness of the green EML 424G may be adjusted to be within a range of 20 nm to 50 nm, based on an optical distance of the light emitting device and a driving voltage that increases as the thickness of the green EML 424G becomes thicker.

A plurality of ECLs 428R, 428G, and 428B may be respectively disposed adjacent to the EMLs 424R, 424G, and 424B. The ECLs 428R, 428G, and 428B may confine an exciton of the red EML 424R, the green EML 424G, and the blue EML 424B, thereby enhancing emission efficiency. Also, the ECLs 428R, 428G, and 428B may each be formed of one or more of tris(8-hydroxy-quinolinato)aluminum (Alq₃), 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), bis(2-methyl-8-quinolinolate)-4-(phenylphenolato)aluminum (BAlq), 8-hydrozyquinolinolato-lithium (Liq), 2,9-dimethyl-4,7-diphenyl-1,10-phenanthroline (BCP), 2-methyl-9,10-bis(naphthalene-2-yl) anthracene (MADN), 2,5-bis-(2,2-bipyridin-6-yl)-1,1-dimethyl-3,4-diphenyl-silole (PyPySPyPy), 2,2',2"-(1,3,5-benzinetriyl)-tris(1-phenyl-1-H-benzimidazole) (TPBi), etc., but is not limited thereto.

An energy band diagram of each of the second HTL 423G, the green EML 424G, the ECL 428G, and the ETL 426 will be described below with reference to FIG. 3.

Figure 3:
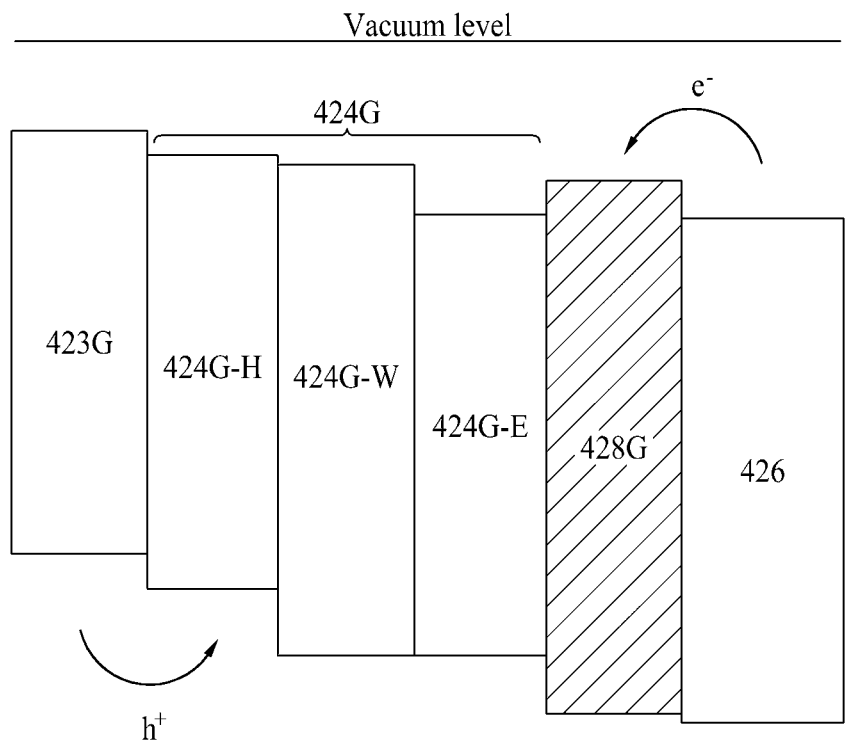
FIG. 3 is a diagram showing an energy band diagram according to a first embodiment of the present disclosure.

FIG. 3 is a diagram showing an energy band diagram according to a first embodiment of the present disclosure. In FIG. 3, h+ indicates a hole, and v- indicates an electron.

Referring to FIG. 3, the green EML 424G of the organic light emitting display device 1000 according to the first embodiment of the present disclosure may include a mixed host and an electron-type host. The mixed host may be produced by mixing the hole-type host 424G-H and the first host 424G-W.

The green EML 424G may include an excited state complex (exciplex) that includes a mixed host and an electron-type host. The exciplex may denote a dimer or a molecular complex which is formed between atom-molecules having an excited state and atom-molecule having a ground state. In detail, the exciplex may be produced based on different energy values of a plurality of different organic materials in an EML, and light may be emitted based on the energy corresponding to a difference between the different energy values. Generally, in a case where the exciplex is applied to the EML, a color of emitted light may be adjusted, but emission efficiency is considerably reduced. Therefore, it was recognized that the use of the exciplex is unsuitable to obtain an efficient light emitting device. However, the inventors have recognized that emission efficiency is further enhanced in the case of using the exciplex as an energy transfer medium. Therefore, by adjusting triplet energy levels of a plurality of host materials included in a phosphorescent EML, emission efficiency is further enhanced through emission of light caused by the exciplex. When light is emitted by energy transferred from the exciplex (the energy transfer medium) to a dopant of the EML, emission efficiency is further enhanced.

In order for a hole to be easily injected into the green EML 424G, the highest occupied molecular orbital (HOMO) energy level of each of the hole-type host 424G-H, the first host 424G-W, and the electron-type host 424G-E may have a level between a HOMO energy level of the second HTL 423G and a HOMO energy level of the ETL 426. That is, in order for a hole to be injected into the green EML 424G, the hole-type host 424G-H may be disposed adjacent to the first HTL 421 or the second HTL 423G.

In order for an electron to be easily injected into the green EML 424G, the lowest unoccupied molecular orbital (LUMO) energy level of the hole-type host 424G-H may have a level similar to a LUMO energy level of the second HTL 423G. A LUMO energy level of the first host 424G-W may have a level between a LUMO energy level of the hole-type host 424G-H and a LUMO energy level of the electron-type host 424G-E, and a HOMO energy level of the first host 424G-W may have a level similar to a HOMO energy level of the electron-type host 424G-E, whereby the first host 424G-W may be configured to have a widest bandgap among the three hosts. Therefore, a bandgap of the first host 424G-W may have a bandgap which is wider than a bandgap of the hole-type host 424G-H and a bandgap of the electron-type host 424G-E. Therefore, the first host 424G-W may be referred to as a wide bandgap host. A bandgap of the first host 424G-W may be within a range of 3.0 eV to 3.5 eV. The bandgap denotes a difference between a HOMO energy level and a LUMO energy level.

In FIG. 3, a case where the second HTL 423G is provided in the emission part 420 has been described above as an example, but the second HTL 423G may not be provided depending on the structure or characteristic of the organic light emitting display device 1000. In this case, a HOMO energy level and a LUMO energy level of the first HTL 421 may be applied identically to the above-described HOMO energy level and LUMO energy level of the second HTL 423G. Therefore, the first HTL 421 and the second HTL 423G may each be referred to as a HTL.

A triplet energy level of each of the second HTL 423G, the green EML 424G, the ECL 428G, and the ETL 426 will be described below with reference to FIG. 4.

Figure 4:
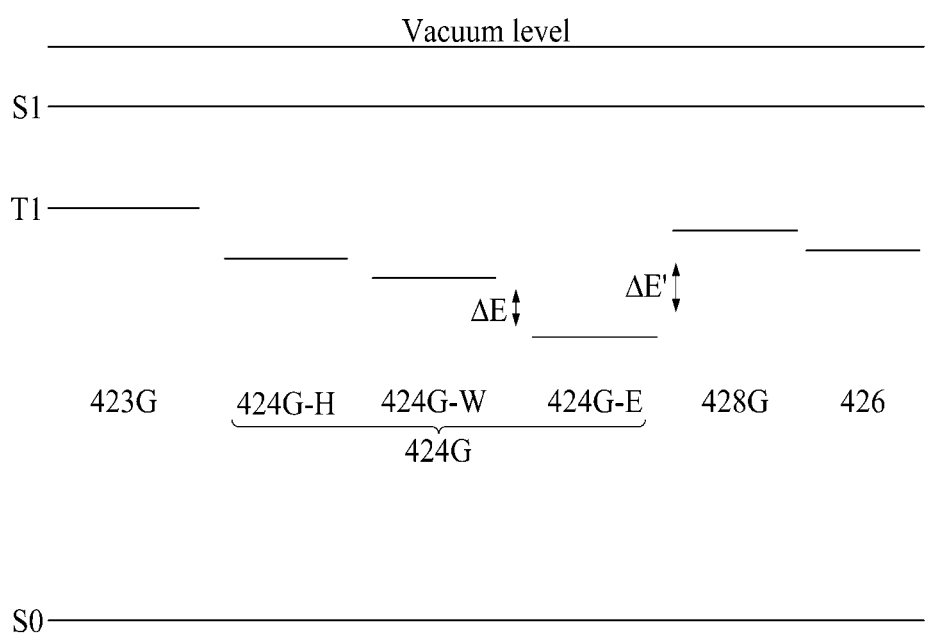
FIG. 4 is a diagram showing a triplet energy level according to a first embodiment of the present disclosure.

FIG. 4 is a diagram showing a triplet energy level according to a first embodiment of the present disclosure.

Luminescence denotes a phenomenon where a material is excited by energy based on an electromagnetic wave, heat, or friction and emits light having a specific wavelength with the energy. In an organic light emitting device, an emitting material of an EML is shifted to an excited state S1 by energy based on a combination of an electron and a hole and emits light when the excited state S1 is shifted to a ground state S0.

Luminescence where the excited state S1 (i.e., a singlet energy level) is directly shifted to the ground state S0 may be referred to as fluorescence. Luminescence where the excited state S1 is shifted to the ground state S0 via a relatively low triplet energy level T1 may be referred to as phosphorescence.

In order to prevent an exciton generated by a combination of a hole and an electron from being dissipated in the green EML 424G, the green EML 424G may be configured to have a triplet energy level T1 lower than a triplet energy level T1 of the second HTL 423G and a triplet energy level T1 of the ETL 426. That is, a triplet energy level T1 of the green EML 424G may be a triplet energy level T1 which is lower than the triplet energy level T1 of the second HTL 423G and the triplet energy level T1 of the ETL 426. Alternatively, when the triplet energy level of the green EML 424G is G(T1), the triplet energy level of the second HTL 423G is HTL(T1), and the triplet energy level of the ETL 426 is ETL(T1), HTL(T1)>G(T1) and G(T1)<ETL(T1) may be satisfied. Also, the triplet energy level T1 of the green EML 424G may be adjusted lower than a triplet energy level T1 of the ECL 428G, and moreover may be adjusted lower than the triplet energy level T1 of the second HTL 423G. Therefore, an exciton of the green EML 424G is prevented from being dissipated, and the exciton may be confined in the green EML 424G by the ECL 428G, thereby further enhancing emission efficiency.

Moreover, a triplet energy level T1 of the first host 424G-W, a triplet energy level T1 of the hole-type host 424G-H, and a triplet energy level T1 of the electron-type host 424G-E may be adjusted in order for the green EML 424G to generate an exciplex to enhancing emission efficiency. That is, the triplet energy level T1 of the first host 424G-W and the triplet energy level T1 of the hole-type host 424G-H may be adjusted higher than the triplet energy level T1 of the electron-type host 424G-E. In detail, the triplet energy level T1 of the first host 424G-W and the triplet energy level T1 of the hole-type host 424G-H may be adjusted 0.04 eV to 0.10 eV higher than the triplet energy level T1 of the electron-type host 424G-E. Also, in order for the exciplex not to be dissipated by the electron-type host 424G-E, the triplet energy level T1 of the electron-type host 424G-E may be adjusted lower than the triplet energy level T1 of the hole-type host 424G-H and the triplet energy level T1 of the first host 424G-W. Therefore, the exciplex of the green EML 424G may be formed by the first host 424G-W, the hole-type host 424G-H, and the electron-type host 424G-E. Accordingly, the emission efficiency of the green EML 424G is enhanced by the exciplex included in the green EML 424G.

The ECL 428G may be disposed adjacent to the electron-type host 424G-E included in the green EML 424G. Also, a triplet energy level T1 of the ECL 428G may be adjusted higher than a triplet energy level T1 of the electron-type host 424G-E. Also, a difference (ΔE') between the triplet energy level T1 of the ECL 428G and the triplet energy level T1 of the electron-type host 424G-E may be adjusted greater than a difference (ΔE') between the triplet energy level T1 of the first host 424G-W and the triplet energy level T1 of the electron-type host 424G-E. Therefore, the exciplex may be maintained in the green EML 424G by adjusting the triplet energy level T1 of the hole-type host 424G-H, the triplet energy level T1 of the first host 424G-W, and the triplet energy level T1 of the ECL 428G with respect to the triplet energy level T1 of the electron-type host 424G-E. Also, the ECL 428G may be further disposed adjacent to the electron-type host 424G-E in order for the exciplex to be maintained in the green EML 424G, and thus, the exciton may be confined in the green EML 424G, thereby further enhancing emission efficiency.

Therefore, when the triplet energy level T1 of the ECL 428G is ECL(T1), the triplet energy level T1 of the electron-type host 424G-E is E(T1), and the triplet energy level T1 of the first host 424G-W is W(T1), ECL(T1)>W(T1)>E(T1) may be satisfied. Also, when the triplet energy level T1 of the hole-type host 424G-H is H(T1), H(T1)>W(T1)>E(T1) may be satisfied. Also, when the triplet energy level T1 of the hole-type host 424G-H is H(T1), ECL(T1)>H(T1)>W(T1)>E(T1) may be satisfied. Therefore, triplet energy levels of hosts included in the green EML 424G may be adjusted, and thus, the exciplex may be formed in the green EML 424G, thereby enhancing the emission efficiency of the green EML 424G. Also, the ECL 428G may be further disposed adjacent to the green EML 424G, and thus, the exciton may be confined in the green EML 424G, thereby further enhancing emission efficiency.

In FIG. 4, a case where the second HTL 423G is provided in the emission part 420 has been described above as an example, but the second HTL 423G may not be provided depending on the structure or characteristic of the organic light emitting display device 1000. In this case, a triplet energy level of the first HTL 421 may be applied identically to the above-described triplet energy level of the second HTL 423G. Therefore, the first HTL 421 and the second HTL 423G may each be referred to as a HTL.

Figure 5:
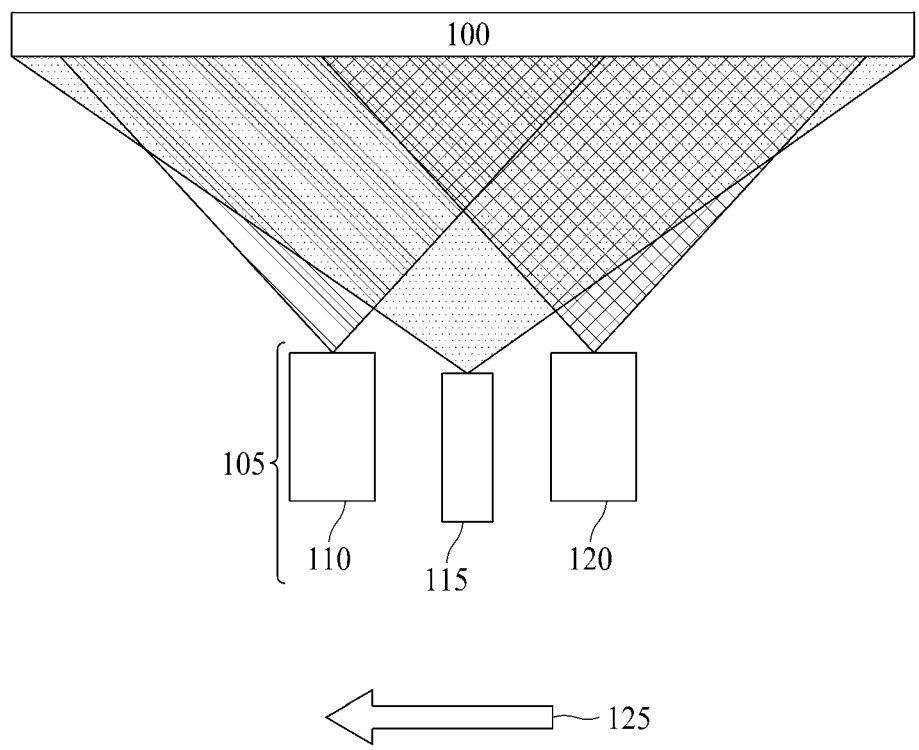
FIG. 5 is a diagram illustrating a method of forming a green emission layer according to a first embodiment of the present disclosure.

FIG. 5 is a diagram illustrating a method of forming the green EML 424G of the organic light emitting display device 1000 according to the first embodiment of the present disclosure described above with reference to FIG. 2.

Referring to FIG. 5, an apparatus for forming the green EML 424G of the organic light emitting display device 1000 according to the first embodiment of the present disclosure may include an evaporation source 105 that includes first and second evaporation sources 110 and 120 for evaporating a green host material on the substrate 100 and a third evaporation source 115 for evaporating a green dopant material on the substrate 100.

A hole-type host material and a first host material, having a bandgap wider than that of each of the hole-type host material and an electron-type host material, may be mixed in the first evaporation source 110. The first evaporation source 110 may move in one direction 125 of FIG. 5 with respect to the substrate 100 which is fixed in position, and thus, the hole-type host material and the first host material having a wide bandgap may be formed on the substrate 100 through a thermal evaporation process.

An electron-type host material may be provided in the second evaporation source 120. The electron-type host material may be evaporated on the substrate 100 through the thermal evaporation process while the second evaporation source 120 is moving in the direction 125 of FIG. 5 at the same time with the first evaporation source 110 with respect to the substrate 100 in fixed position.

A green dopant material may be provided in the third evaporation source 115. While the third evaporation source 115 is moving in the one direction 125 of FIG. 5 along with the first evaporation source 110 and the second evaporation source 120 with respect to the substrate 100 which is fixed in position, the green dopant material may be evaporated on the substrate 100 through the thermal evaporation process.

Through the above-described process, the first to third evaporation sources 110, 120, and 115 may scan in the one direction 125 once with respect to the substrate 100 which is fixed in position, and thus, a green EML including a hole-type host material, a first host material, an electron-type host material, and a dopant material may be formed in the organic light emitting display device according to the first embodiment of the present disclosure. Also, the first host material may have a bandgap wider than that of each of the hole-type host material and the electron-type host material.

Considering a process of evaporating and forming the green EML 424G on the substrate 100, when a hole-type host material and a first host material have a large difference in mixing ratio in one evaporation source, non-uniform evaporation occurs in host materials included in the green EML 424G. In addition, non-uniform evaporation occurs in host materials included in the green EML 424G due to an evaporation distance difference between a plurality of evaporation sources and the substrate 100. Therefore, a mixing ratio of the hole-type host material to the first host material may be one among 1:1, 2:1 to 3:1, and 1:2 to 1:3 in volume ratio.

Therefore, a ratio of a hole-type host to a first host to an electron-type host included in the green EML 424G may be 1:1:1 in volume ratio. Alternatively, a ratio of the hole-type host to the first host to the electron-type host included in the green EML 424G may be one among (2 to 3):1:1, 1:(2 to 3):1, and 1:1:(2 to 3) in volume ratio. Alternatively, a ratio of the hole-type host to the first host to the electron-type host included in the green EML 424G may be one among (2 to 3):(2 to 3):1, (2 to 3):1:(2 to 3), and 1:(2 to 3):(2 to 3) in volume ratio. Here, the volume ratio denotes a volume of a portion of a layer occupied by a certain material and is based on a sum of the occupied volumes.

In the first embodiment of the present disclosure, it has been described that the exciplex is formed in the green EML 424G, but the present embodiment is not limited thereto. In other embodiments, an exciplex may be formed in at least one among the red EML 424R and the blue EML 424B.

In the first embodiment of the present disclosure, an organic light emitting display device including one emission part has been described as an example, but the present disclosure is not limited thereto. In other embodiments, three or more hosts and at least one dopant included in a green EML and an ECL according to the first embodiment of the present disclosure may be applied to two or more emission parts. This will be described below with reference to FIGS. 6 and 7.

Figure 6:
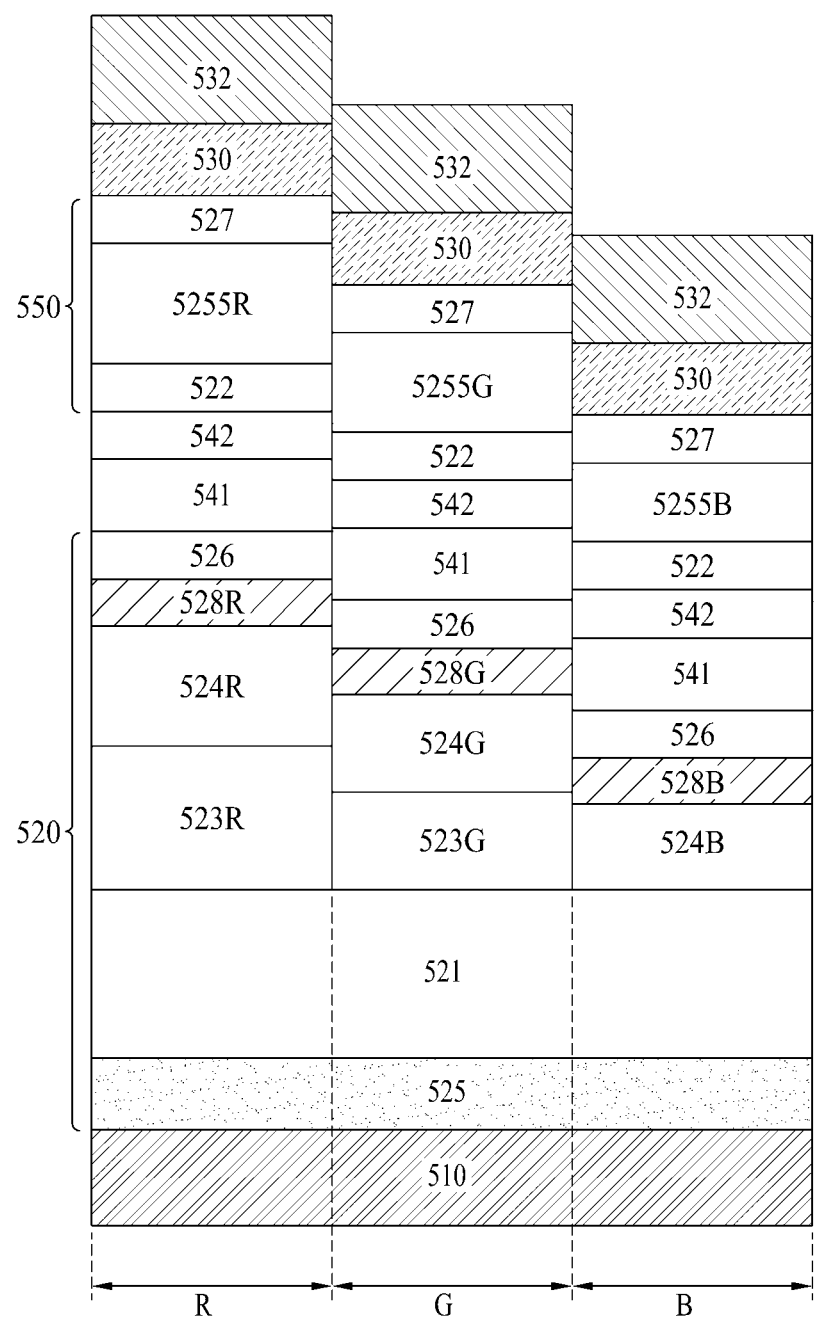
FIG. 6 is a diagram illustrating elements of the organic light emitting display device according to the second embodiment of the present disclosure.

FIG. 6 is a diagram illustrating elements of an organic light emitting display device 2000 according to a second embodiment of the present disclosure. Also, FIG. 6 illustrates elements of the organic light emitting display device 2000, and a thickness of each of the elements does not limit details of the present disclosure.

The organic light emitting display device 2000 may include a plurality of adjacent pixels R, G, and B. In detail, the organic light emitting display device 2000 may include a red pixel R, a green pixel G, and a blue pixel B. The three pixels R, G, and B may constitute a minimum of group for realizing white light. In the organic light emitting display device 2000, the three pixels R, G, and B may be repeatedly arranged to display an image.

Referring to FIG. 6, the organic light emitting display device 2000 according to the second embodiment of the present disclosure may include a first emission part 520 and a second emission part 550 between a first electrode 510 and a second electrode 530. The first electrode 510, the second electrode 530, and the first emission part 520 illustrated in FIG. 6 may be substantially the same as the first electrode 410, the second electrode 430, and the emission part 420 described above with reference to FIG. 2, and thus, their detailed descriptions are not provided herein.

Referring to FIG. 6, a red light emitting device may be disposed in the red pixel R. The red light emitting device may include a first emission part 520 that includes a P-type HTL 525, a first HTL 521, a second HTL 523R, a first red EML 524R, an ECL 528R, and an ETL 526. Also, the red light emitting device may include a second emission part 550 that includes a third HTL 522, a second red EML 5255R, and a second ETL 527.

A green light emitting device may be disposed in the green pixel G. The green light emitting device may include a first emission part 520 that includes a P-type HTL 525, a first HTL 521, a second HTL 523G, a first green EML 524G, an ECL 528G, and a first ETL 526. Also, the green light emitting device may include a second emission part 550 that includes a third HTL 522, a second green EML 5255G, and a second ETL 527.

A blue light emitting device may be disposed in the blue pixel B. The blue light emitting device may include a first emission part 520 that includes a P-type HTL 525, a first HTL 521, a first blue EML 524B, an ECL 528B, and a first ETL 526. Also, the blue light emitting device may include a second emission part 550 that includes a third HTL 522, a second blue EML 5255B, and a second ETL 527.

A charge generation layer (CGL) may be formed between the first emission part 520 and the second emission part 550. The CGL may be a layer having a common structure and may extend to a top of each of a plurality of first EMLs 524R, 524G, and 524B. The CGL may adjust a charge balance between the first emission part 520 and the second emission part 550 and may include an N-type CGL 541 and a P-type CGL 542. The N-type CGL 541 may inject an electron into the first EMLs 524R, 524G, and 524B. The N-type CGL 541 may be formed as an organic layer doped with metal and/or the like, but is not limited thereto. Also, the P-type CGL 542 may inject a hole into a plurality of second EMLs 5255R, 5255G, and 5255B. The P-type CGL 542 may be formed as an organic layer doped with a P-type dopant, but is not limited thereto.

A capping layer 532 may be further formed on the second electrode 530, for protecting an organic light emitting device. The capping layer 532 may be omitted depending on the structure or characteristic of the organic light emitting device.

An EBL may be further formed between the second HTLs 523R and 523G and the first EMLs 524R and 524G and between the first HTL 521 and the first EML 524B. The EBL prevents an electron from being transferred to the first HTL 521 to enable the hole and the electron to be smoothly recombined in the first EMLs 524R, 524G, and 524B, thereby enhancing the emission efficiency of the light emitting device.

Moreover, the first green EML 524G may include at least three hosts and at least one dopant. The first green EML 524G may be configured substantially identically to the green EML 424G described above with reference to FIG. 2, and thus, its detailed description is not provided.

Descriptions of an energy band diagram and a triplet energy level of the first green EML 524G are substantially the same as the details described above with reference to FIGS. 3 and 4, and thus are omitted. Also, the first green EML 524G may be formed identically to the details described above with reference to FIG. 5.

The ECLs 528R, 528G, and 528B may be respectively disposed adjacent to the first EMLs 524R, 524G, and 524B. The ECLs 528R, 528G, and 528B may be configured substantially identically to the ECLs 428R, 428G, and 428B described above with reference to FIG. 2. Also, descriptions of an energy band diagram and a triplet energy level of each of the ECLs 528R, 528G, and 528B are substantially the same as the details described above with reference to FIGS. 3 and 4, and thus are omitted.

The third HTL 522 of the second emission part 550 may be a layer having a common structure and may extend to a bottom of each of the second EMLs 5255R, 5255G, and 5255B. The third HTL 522 may be formed of a material which is the same as that of the first HTL 521, but is not limited thereto. The third HTL 522 may be formed of one or more of N,N'-bis(naphthalene-1-yl)-N,N-bis(phenyl)-2,2'-dimethylbenzidine (NPD), N,N'-bis-(3-methylphenyl)-N,N'-bis(phenyl)-benzidine (TPD), 2,2',7,7'-tetrakis(N,N-diphenylamino)-9,9-spirobifluorene (Spiro-TAD), and 4,4',4"-tris(N-3-methylphenyl-N-phenylamino)triphenylamine (MTDATA), but is not limited thereto.

The second red EML 5255R of the second emission part 550 may be formed of a material having a peak wavelength which is within a range of approximately 600 nm to 650 nm. The second red EML 5255R may include one or more host materials, and examples of the one or more host materials may include 4,4'-bis(carbozol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), Be complex, etc., but are not limited thereto. Also, a dopant constituting the second red EML 5255R may include a phosphorescent dopant, and examples of the phosphorescent dopant may include bis(2-benzo[b]thiophen-2-yl-pyridine)(acetylacetonate)iridium(III) (Ir(btp)$_2$(acac)), bis(1-phenylisoquinoline)(acetylacetonate)iridium(III) (Ir(piq)$_2$(acac)), tris(1-phenylquinoline)iridium(III) (Ir(piq)$_3$), 5,10,15,20-tetraphenyltetrabenzoporphyrin platinum complex (Pt(TPBP)), etc., but are not limited thereto. Also, the dopant constituting the second red EML 5255R may include a fluorescent dopant, and examples of the fluorescent dopant may include Perylene and the like, but are not limited thereto. The materials of the host or dopant constituting the second red EML 5255R do not limit details of the present disclosure.

The second green EML 5255G of the second emission part 550 may be formed of a material having a peak wavelength which is within a range of approximately 510 nm to 590 nm. The second green EML 5255G may include one or more host materials, and examples of the one or more host materials may include 4,4'-bis(carbozol-9-yl)biphenyl (CBP), 2,2',2"-(1,3,5-benzinetriyl)-tris(1-phenyl-1-H-benz-imidazole) (TPBi), bis(2-methyl-8-quinolinolate)-4-(phe-nylphenolato)aluminum (BAlq), etc., but is not limited thereto. A dopant constituting the second green EML 5255G may include a phosphorescent dopant, and examples of the phosphorescent dopant may include tris(2-phenylpyridine) iridium(III) (Ir(ppy)$_3$), bis(2-phenylpyridine)(acetylaceto-nate)iridium(III) (Ir(ppy)$_2$(acac)), tris[2-(p-tolyl)pyridine] iridium(III) (Ir(mppy)$_3$), N,N'-diethylquinacridone (DEQ), 2,3,6,7-tetrahydro-1,1,7,7-tetramethyl-1H,5H,11H-10-(2-benzothiazolyl)quinolizino[9,9a,1gh]coumarin (C545T), etc., but are not limited thereto. Also, the dopant constituting the second green EML 5255G may include a fluorescent material, and examples of the fluorescent material may include tris(8-hydroxyquinolino)aluminum (Alq$_3$) and the like, but are not limited thereto. The materials of the host or dopant constituting the second green EML 5255G do not limit details of the present disclosure.

The second blue EML 5255B of the second emission part 550 may be a layer emitting blue light and may be formed of a material having a peak wavelength which is within a range of approximately 440 nm to 480 nm. The second blue EML 5255B may include one or more host materials, and examples of the one or more host materials may include 4,4'-bis(carbozol-9-yl)biphenyl (CBP), 1,3-bis(carbazol-9-yl)benzene (MCP), 9,10-di(naphth-2-yl)anthracene (ADN), anthracene derivatives, etc., but are not limited thereto. Also, a dopant constituting the second blue EML 5255B may be a phosphorescent dopant including a dopant material, and examples of the phosphorescent dopant may include bis(3,5-difluoro-2-(2-pyridyl)phenyl-(2-carboxypyridyl)iridium (III) (FIrPic), etc., but are not limited thereto. Also, the dopant constituting the second blue EML 5255B may be a fluorescent dopant, and examples of the fluorescent dopant may include polyfluorene (PFO)-based polymer, polyphe-nylenevinylene (PPV)-based polymer, pyren derivatives, etc., but are not limited thereto. The materials of the host or the dopant constituting the second blue EML 5255B do not limit details of the present disclosure.

The second ETL 527 may smoothly transfer an electron, injected from the second electrode 530, to the second EMLs 5255R, 5255G, and 5255B. The second ETL 527 may be a layer having a common structure and may extend to a top of each of the second EMLs 5255R, 5255G, and 5255B. The second ETL 527 may be formed of, for example, one or more of tris(8-hydroxy-quinolinato)aluminum (Alq$_3$), 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), bis(2-methyl-8-quinolinolate)-4-(phenylphenolato) aluminum (BAlq), 8-hydrozyquinolinolato-lithium (Liq), and 2,2',2"-(1,3,5-benzinetriyl)-tris(1-phenyl-1-H-benzimi-dazole) (TPBi), but is not limited thereto.

An EIL may be further formed on the second ETL 527. The EIL may be formed of, for example, one among tris(8-hydroxy-quinolinato)aluminum (Alq$_3$), 2-(4-biphe-nyl)-5-(4-tert-butylphenyl)-1,3,4-oxadiazole (PBD), 3-(4-biphenyl)-4-phenyl-5-tert-butylphenyl-1,2,4-triazole (TAZ), and bis(2-methyl-8-quinolinolate)-4-(phenylphenolato)alu-minum (BAlq), but is not limited thereto.

Therefore, in the second embodiment of the present disclosure, the first emission part 520 and the second emission part 550 may be provided, the first green EML 524G including the at least three hosts may be provided in the first emission part 520, and the exciplex may include the at least three hosts, thereby enhancing the emission efficiency of the green EML. Also, since the ECLs 528R, 528G, and 528B are further disposed adjacent to the first green EML 524G, an exciton may be confined in the first green EML 524G, thereby further enhancing emission efficiency. Since emission efficiency is enhanced, an organic light emitting display device with enhanced lifetime and consumption power is provided. Also, in a case where two emission parts are provided, since a CGL is provided between the two emission parts, a current density may be maintained at a low level, and a light emitting device may emit light in a high luminance area. Accordingly, since a current density is maintained at a low level, an organic light emitting display device with enhanced lifetime is provided.

In the second embodiment of the present disclosure, it has been described that the exciplex is formed in the first green EML 524G, but the present embodiment is not limited thereto. In other embodiments, an exciplex may be formed in at least one among the first red EML 524R and the first blue EML 524B.

Moreover, in the second embodiment of the present disclosure, it has been described that the ECLs 528R, 528G, and 528B are formed in the first emission part 520, but the present embodiment is not limited thereto. In other embodiments, an ECL may be provided in the second emission part 550. This will be described below with reference to FIG. 7.

Figure 7:
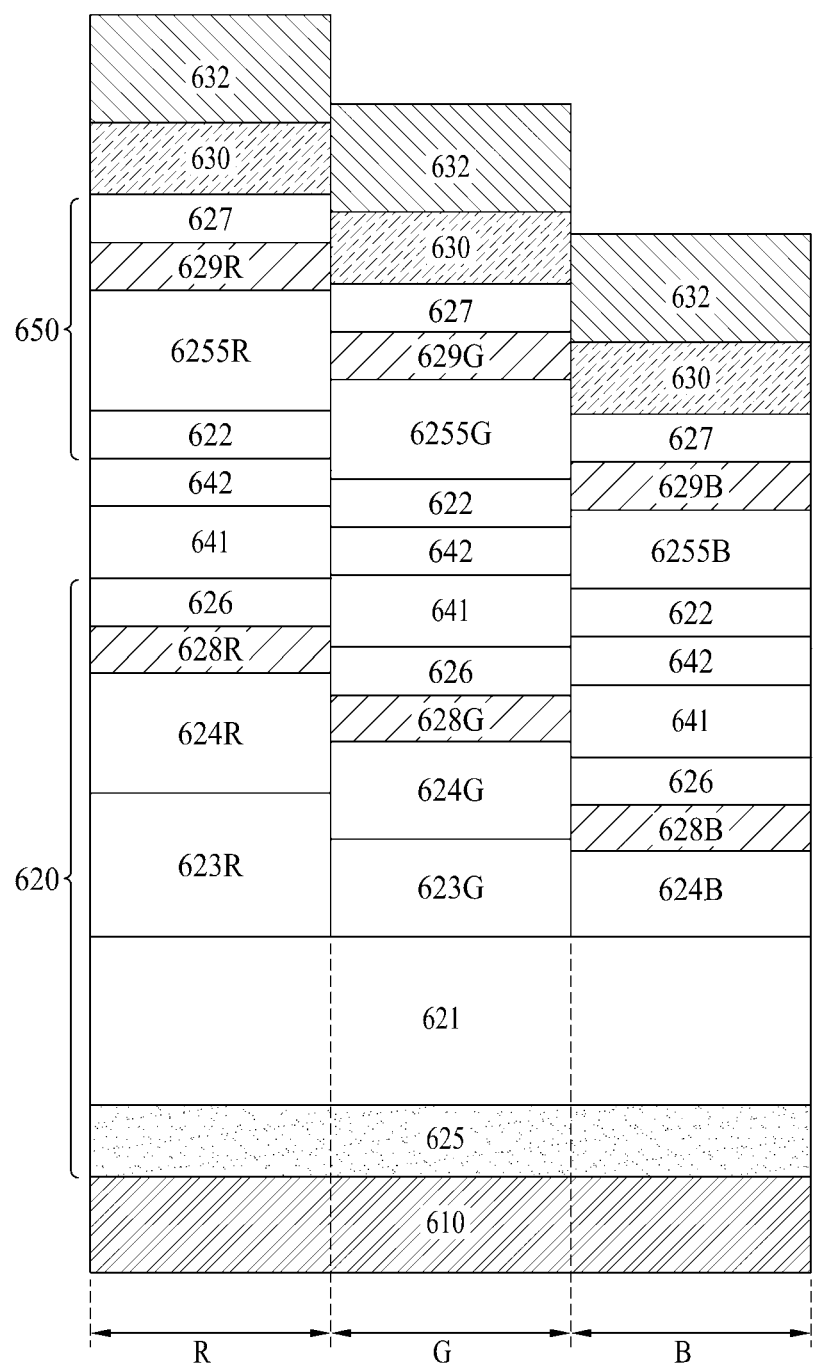
FIG. 7 is a diagram illustrating elements of the organic light emitting display device according to the third embodiment of the present disclosure.

FIG. 7 is a diagram illustrating elements of an organic light emitting display device 3000 according to a third embodiment of the present disclosure. Also, FIG. 7 illustrates elements of the organic light emitting display device 3000, and a thickness of each of the elements does not limit details of the present disclosure.

The organic light emitting display device 3000 may include a plurality of adjacent pixels R, G, and B. In detail, the organic light emitting display device 3000 may include a red pixel R, a green pixel G, and a blue pixel B. Three the pixels R, G, and B may constitute a minimum group for realizing white light. In the organic light emitting display device 3000, the three pixels R, G, and B may be repeatedly arranged to display an image.

Referring to FIG. 7, the organic light emitting display device 3000 according to the third embodiment of the present disclosure may include a first emission part 620 and a second emission part 650 between a first electrode 610 and a second electrode 630. The first electrode 610, the second electrode 630, and the first emission part 620 illustrated in FIG. 7 may be substantially the same as the first electrode 410, the second electrode 430, and the emission part 420 described above with reference to FIG. 2, and thus, their detailed descriptions are not provided herein.

Referring to FIG. 7, a red light emitting device may be disposed in the red pixel R. The red light emitting device may include a first emission part 620 that includes a P-type HTL 625, a first HTL 621, a second HTL 623R, a first red EML 624R, a first ECL 628R, and a first ETL 626. Also, the red light emitting device may include a second emission part 650 that includes a third HTL 622, a second red EML 6255R, a second ECL 629R, and a second ETL 627.

A green light emitting device may be disposed in the green pixel G. The green light emitting device may include a first emission part 620 that includes a P-type HTL 625, a first HTL 621, a second HTL 623G, a first green EML 624G, a first ECL 628G, and a first ETL 626. Also, the green light emitting device may include a second emission part 650 that includes a third HTL 622, a second green EML 6255G, a second ECL 629G, and a second ETL 627.

A blue light emitting device may be disposed in the blue pixel B. The blue light emitting device may include a first emission part 620 that includes a P-type HTL 625, a first HTL 621, a first blue EML 624B, a first ECL 628B, and a first ETL 626. Also, the blue light emitting device may include a second emission part 650 that includes a third HTL 622, a second blue EML 6255B, a second ECL 629B, and a second ETL 627.

A CGL may be formed between the first emission part 620 and the second emission part 650. The CGL may be a layer having a common structure and may extend to a top of each of a plurality of first EMLs 624R, 624G, and 624B. The CGL may adjust a charge balance between the first emission part 620 and the second emission part 650 and may include an N-type CGL 641 and a P-type CGL 642. The N-type CGL 641 may inject an electron into the first EMLs 624R, 624G, and 624B. The N-type CGL 641 may be formed as an organic layer doped with metal and/or the like, but is not limited thereto. Also, the P-type CGL 642 may inject a hole into a plurality of second EMLs 6255R, 6255G, and 6255B. The P-type CGL 642 may be formed as an organic layer doped with a P-type dopant, but is not limited thereto.

A capping layer 632 may be further formed on the second electrode 630, for protecting an organic light emitting device. The capping layer 632 may be omitted depending on the structure or characteristic of the organic light emitting device.

An EBL may be further formed between the second HTLs 623R and 623G and the first EMLs 624R and 624G and between the first HTL 621 and the first EML 624B. The EBL prevents an electron from being transferred to the first HTL 621 to enable the hole and the electron to be smoothly recombined in the first EMLs 624R, 624G, and 624B, thereby enhancing the emission efficiency of the light emitting device.

The first ECLs 628R, 628G, and 628B may be respectively disposed adjacent to the first EMLs 624R, 624G, and 624B.

Moreover, the first green EML 624G may include at least three hosts and at least one dopant. The at least three hosts may include a hole-type host, a first host, and an electron-type host. Also, the hole-type host and the first host may constitute a mixed host. Also, a HOMO energy level, a LUMO energy level, and a triplet energy level of the first green EML 624G may be substantially the same as the details described above with reference to FIGS. 3 and 4, but their descriptions will be described below.

In order for a hole to be easily injected into the first green EML 624G, a HOMO energy level of each of the hole-type host, the first host, and the electron-type host may have a level between a HOMO energy level of the second HTL 623G and a HOMO energy level of the first ETL 626. That is, in order for a hole to be injected into the first green EML 624G, the hole-type host may be disposed adjacent to the second HTL 623G. Also, in order for an electron to be easily injected into the first green EML 624G, a LUMO energy level of the hole-type host may have a level similar to a LUMO energy level of the second HTL 623G. Therefore, a LUMO energy level of the first host may have a level between a LUMO energy level of the hole-type host and a LUMO energy level of the electron-type host, and a HOMO energy level of the first host may have a level similar to a HOMO energy level of the electron-type host, whereby the first host may be configured to have a widest bandgap among the three hosts. Therefore, a bandgap of the first host 424G-W may have a bandgap which is wider than a bandgap of the hole-type host 424G-H and a bandgap of the electron-type host 424G-E. Therefore, a bandgap of the first host may have a bandgap wider than a bandgap of the hole-type host and a bandgap of the electron-type host. Accordingly, the first host may be referred to as a wide bandgap host. A bandgap of the first host may be within a range of 3.0 eV to 3.5 eV.

In order to prevent an exciton generated by a combination of a hole and an electron from being dissipated in the first green EML 624G, the first green EML 624G may be configured to have a triplet energy level T1 lower than a triplet energy level T1 of the second HTL 623G and a triplet energy level T1 of the first ETL 626. That is, a triplet energy level T1 of the first green EML 624G may be a triplet energy level T1 which is lower than the triplet energy level T1 of the second HTL 623G and the triplet energy level T1 of the first ETL 626. Alternatively, when the triplet energy level of the first green EML 624G is G(T1), the triplet energy level of the second HTL 623G is HTL(T1), and the triplet energy level of the first ETL 626 is ETL(T1), HTL(T1)>G(T1) and G(T1)<ETL(T1) may be satisfied. Also, the triplet energy level T1 of the first green EML 624G may be adjusted lower than a triplet energy level T1 of the first ETL 626, and moreover may be adjusted lower than the triplet energy level T1 of the second HTL 623G. Therefore, an exciton of the first green EML 624G is prevented from being dissipated, and the exciton may be confined in the first green EML 624G by the first ECL 628G, thereby further enhancing emission efficiency.

Moreover, a triplet energy level T1 of the first host, a triplet energy level T1 of the hole-type host, and a triplet energy level T1 of the electron-type host may be adjusted in order for the first green EML 624G to generate an exciplex to enhancing emission efficiency. That is, the triplet energy level T1 of the first host and the triplet energy level T1 of the hole-type host may be adjusted higher than the triplet energy level T1 of the electron-type host. In detail, the triplet energy level T1 of the first host and the triplet energy level T1 of the hole-type host may be adjusted 0.04 eV to 0.10 eV higher than the triplet energy level T1 of the electron-type host. Also, in order for the exciplex not to be dissipated by the electron-type host, the triplet energy level T1 of the electron-type host may be adjusted lower than the triplet energy level T1 of the hole-type host and the triplet energy level T1 of the first host. Therefore, the exciplex of the first green EML 624G may be formed by the first host, the hole-type host, and the electron-type host 424G-E. Accordingly, the emission efficiency of the first green EML 624G is enhanced by the exciplex included in the first green EML 624G.

The first ECL 628G may be disposed adjacent to the electron-type host included in the first green EML 624G. Also, a triplet energy level T1 of the first ECL 628G may be adjusted higher than a triplet energy level T1 of the electron-type host. Also, a difference (ΔE') between the triplet energy level T1 of the first ECL 628G and the triplet energy level T1 of the electron-type host may be adjusted greater than a difference (ΔE') between the triplet energy level T1 of the first host and the triplet energy level T1 of the electron-type host. Therefore, the exciplex may be maintained in the first green EML 624G by adjusting the triplet energy level T1 of the hole-type host, the triplet energy level T1 of the first host, and the triplet energy level T1 of the first ECL 628G with respect to the triplet energy level T1 of the electron-type host. Also, the first ECL 628G may be disposed adjacent to the electron-type host in order for the exciplex to be maintained in the first green EML 624G, and thus, the exciton may be confined in the first green EML 624G, thereby further enhancing emission efficiency.

Therefore, when the triplet energy level T1 of the first ECL 628G is ECL(T1), the triplet energy level T1 of the electron-type host is E(T1), and the triplet energy level T1 of the first host is W(T1), ECL(T1)>W(T1)>E(T1) may be satisfied. Also, when the triplet energy level T1 of the hole-type host is H(T1), H(T1)>W(T1)>E(T1) may be satisfied. Also, when the triplet energy level T1 of the hole-type host is H(T1), ECL(T1)>H(T1)>W(T1)>E(T1) may be satisfied. Therefore, triplet energy levels of hosts included in the first green EML 624G may be adjusted, and thus, the exciplex may be formed in the first green EML 624G, thereby enhancing the emission efficiency of the first green EML 624G. Also, the first ECL 628G may be further provided, and thus, the exciton may be confined in the first green EML 624G, thereby further enhancing emission efficiency.

The hole-type host included in the first green EML 624G may include one among 4,4'-bis(carbozol-9-yl)biphenyl (CBP), 4,4',4"-tris(carbazol-9-yl)triphenylamine (TcTa), N,N'-bis(nathphalen-1-yl)-N,N'-bis(phenyl)-benzidine (NPB), etc., but is not limited thereto. The first host included in the first green EML 624G may include one among 1,3-bis(carbazol-9-yl)benzene (MCP), N,N'-bis(naphthalene-1-yl)-N,N'-bis(phenyl)-2,2'-dimethylbenzidine (NPD), Be complex, anthracene derivatives, etc., but is not limited thereto. The electron-type host included in the first green EML 624G may include one among 2,2',2"-(1,3,5-benzinetriyl)-tris(1-pheynl-1-H-benzimidazole) (TPBi), 4,6-bis(3,5-di(pyridine-3-yl)phenyl)-2-methylpyrimidine (B3PYMPM), 1,3-bis[3,5-di(pyridin-3-yl)phenyl]benzene (BmPyPhB), poly(p-phenylenevinylene) (PPV), bis(2-methyl-8-quinolinolate)-4-(phenylphenolato)aluminum (BAlq), etc., but is not limited thereto. Also, a dopant included in the first green EML 624G may include a phosphorescent dopant, and examples of the phosphorescent dopant may include tris(2-phenylpyridine)iridium(III) (Ir(ppy)$_3$), bis(2-phenylpyridine)(acetylacetonate)iridium(III) (Ir(ppy)$_2$(acac)), N,N'-diethylquinacridone (DEQ), 2,3,6,7-tetrahydro-1,1,7,7-tetramethyl-1H,5H,11H-10-(2-benzothi-azolyl)quinolizino[9,9a,1gh]coumarin (C545T), etc., but are not limited thereto.

Moreover, a mixing ratio of a hole-type host material to a first host material included in the first green EML 624G may be one among 1:1, (2 to 3):1, and 1:(2 to 3) in volume ratio. Also, a ratio of a hole-type host to a first host to an electron-type host included in the first green EML 624G may be 1:1:1 in volume ratio. Alternatively, a ratio of the hole-type host to the first host to the electron-type host may be one among (2 to 3):1:1, 1:(2 to 3):1, and 1:1:(2 to 3) in volume ratio. Alternatively, a ratio of the hole-type host to the first host to the electron-type host may be one among (2 to 3):(2 to 3):1, (2 to 3):1:(2 to 3), and 1:(2 to 3):(2 to 3) in volume ratio. Here, the volume ratio denotes a volume of a portion of a layer occupied by a certain material and is based on a sum of the occupied volumes.

When a doping concentration of a dopant included in the first green EML 624G increases, the dopant may act as a trap site in the first green EML 624G, and for this reason, when the first green EML 624G emits light, efficiency is reduced. Therefore, the phosphorescent dopant included in the first green EML 624G may be doped at a concentration which is within a range of 3% to 20%, and for example, may be doped at a concentration which is within a range of 5% to 10%. Also, a thickness of the first green EML 624G may be adjusted to within a range of 20 nm to 50 nm, based on an optical distance of the light emitting device and a driving voltage that increases as the thickness of the first green EML 624G becomes thicker.

The first ECLs 628R, 628G, and 628B may be respectively disposed adjacent to the first EMLs 624R, 624G, and 624B. The first ECLs 628R, 628G, and 628B may confine an exciton of the first green EML 624G, thereby enhancing emission efficiency. Also, the first ECLs 628R, 628G, and 628B may each be formed of one or more of tris(8-hydroxy-quinolinato)aluminum (Alq$_3$), 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), bis(2-methyl-8-quinolinolate)-4-(phenylphenolato)aluminum (BAlq), 8-hydrozyquinolinolato-lithium (Liq), 2,9-dimethyl-4,7-diphenyl-1,10-phenanthroline (BCP), 2-methyl-9,10-bis(naphthalene-2-yl)anthracene (MADN), 2,5-bis-(2,2-bipyridin-6-yl)-1,1-dimethyl-3,4-diphenyl-silole (PyPySPyPy), 2,2',2"-(1,3,5-benzinetriyl)-tris(1-phenyl-1-H-benzimidazol e) (TPBi), etc., but is not limited thereto.

Moreover, the first green EML 624G may be formed identically to the details described above with reference to FIG. 5.

The third HTL 622 of the second emission part 650 may be a layer having a common structure and may extend to a bottom of each of the second EMLs 6255R, 6255G, and 6255B. The third HTL 622 may be formed of a material which is the same as that of the first HTL 621, but is not limited thereto. The third HTL 622 may be formed of one or more of N,N'-bis(naphthalene-1-yl)-N,N'-bis(phenyl)-2,2'-dimethylbenzidine (NPD), N,N'-bis-(3-methylphenyl)-N,N'-bis(phenyl)-benzidine (TPD), 2,2',7,7'-tetrakis(N,N-diphenylamino)-9,9-spirobifluorene (Spiro-TAD), and 4,4',4"-tris(N-3-methylphenyl-N-phenylamino)triphenylamine (MTDATA), but is not limited thereto.

The second red EML 6255R of the second emission part 650 may be formed of a material having a peak wavelength which is within a range of approximately 600 nm to 650 nm. The second red EML 6255R may include one or more host materials, and examples of the one or more host materials may include 4,4'-bis(carbozol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), Be complex, etc., but are not limited thereto. Also, a dopant constituting the second red EML 6255R may include a phosphorescent dopant, and examples of the phosphorescent dopant may include bis(2-benzo[b]thiophen-2-yl-pyridine)(acetylacetonate(iridium(III) (Ir(btp)$_2$(acac)), bis(1-phenylisoquinoline)(acetylacetonate)iridium(III) (Ir(piq)$_2$(acac)), tris(1-phenylquinoline)iridium(III) (Ir(piq)$_3$), 5,10,15,20-tetraphenyltetrabenzoporphyrin platinum complex (Pt (TPBP)), etc., but are not limited thereto. Also, the dopant constituting the second red EML 6255R may include a fluorescent dopant, and examples of the fluorescent dopant may include Perylene and the like, but are not limited thereto. The materials of the host or dopant constituting the second red EML 6255R do not limit details of the present disclosure.

The second blue EML 6255B of the second emission part 650 may be a layer emitting blue light and may be formed of a material having a peak wavelength which is within a range of approximately 440 nm to 480 nm. The second blue EML 6255B may include one or more host materials, and examples of the one or more host materials may include 4,4'-bis(carbozol-9-yl)biphenyl (CBP), 1,3-bis(carbazol-9-yl)benzene (MCP), 9,10-di(naphth-2-yl)anthracene (ADN), anthracene derivatives, etc., but are not limited thereto. Also, a dopant constituting the second blue EML 6255B may be a phosphorescent dopant including a dopant material, and examples of the phosphorescent dopant may include bis(3, 5-difluoro-2-(2-pyridyl)phenyl-(2-carboxypyridyl)iridium (III) (FlrPic), etc., but are not limited thereto. Also, the dopant constituting the second blue EML 6255B may be a fluorescent dopant, and examples of the fluorescent dopant may include polyfluorene (PFO)-based polymer, polyphenylenevinylene (PPV)-based polymer, pyren derivatives, etc., but are not limited thereto. The materials of the host or the dopant constituting the second blue EML 6255B do not limit details of the present disclosure.

The second ECLs 629R, 629G, and 629B may be respectively disposed adjacent to the second EMLs 6255R, 6255G, and 6255B. The second ECLs 629R, 629G, and 629B may be configured substantially identically to the first ECLs 628R, 628G, and 628B, and thus, their detailed descriptions are omitted.

Moreover, the second green EML 6255G may include at least three hosts and at least one dopant. The second green EML 6255G may be configured substantially identically to the first green EML 624G, and thus, its detailed description is omitted.

Moreover, descriptions of an energy band diagram and a triplet energy level of the second green EML 6255G are substantially the same as the details described above with reference to FIGS. 3 and 4, and thus are omitted. Also, the second green EML 6255G may be formed identically to the details described above with reference to FIG. 5.

The second ETL 627 may smoothly transfer an electron, injected from the second electrode 630, to the second EMLs 6255R, 6255G, and 6255B. The second ETL 627 may be a layer having a common structure and may extend to a top of each of the second EMLs 6255R, 6255G, and 6255B. The second ETL 627 may be formed of, for example, one or more of tris(8-hydroxy-quinolinato)aluminum ($Alq_3$), 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), bis(2-methyl-8-quinolinolate)-4-(phenylphenolato) aluminum (BAlq), 8-hydrozyquinolinolato-lithium (Liq), and 2,2',2"-(1,3,5-benzinetriyl)-tris(1-phenyl-1-H-benzimidazole) (TPBi), but is not limited thereto.

An EIL may be further formed on the second ETL 627. The EIL may be formed of, for example, one among tris(8-hydroxy-quinolinato)aluminum ($Alq_3$), 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), and bis(2-methyl-8-quinolinolate)-4-(phenylphenolato)aluminum (BAlq), but is not limited thereto.

Therefore, in the third embodiment of the present disclosure, the first emission part 620 and the second emission part 650 may be provided, the first green EML 624G and the second green EML 6255G including at least three hosts may be respectively provided in the first emission part 620 and the second emission part 650, and the exciplex may include the at least three hosts, thereby enhancing the emission efficiency of the green EML. Also, since the first and second ECLs 628R, 628G, 628B, 629R, 629G, and 629B are further disposed adjacent to the first and second green EMLs 624G and 6255G, an exciton may be confined in the first and second green EMLs 624G and 6255G, thereby further enhancing emission efficiency. Since emission efficiency is enhanced, an organic light emitting display device with enhanced lifetime and consumption power is provided. Also, in a case where two emission parts are provided, since a CGL is provided between the two emission parts, a current density may be maintained at a low level, and a light emitting device may emit light in a high luminance area. Accordingly, since a current density is maintained at a low level, an organic light emitting display device with enhanced lifetime is provided.

In the third embodiment of the present disclosure, it has been described that the exciplex is formed in the first and second green EMLs 624G and 6255G, but the present embodiment is not limited thereto. In other embodiments, an exciplex may be formed in at least one among the first red EML 624R, the second green EML 6255G, the first blue EML 624B, and the second blue EML 6255B.

The organic light emitting display device according to the first to third embodiments of the present disclosure may be implemented as a display device including three pixels (for example, a red (R) pixel, a green (G) pixel, and a blue (B) pixel) which each include a mono color device. Therefore, a display device which combines three primary colors of RGB to express various colors may be implemented. Also, the organic light emitting display device according to the first to third embodiments of the present disclosure may be applied to a bottom emission display device, a top emission display device, a dual emission display device, a lighting device for vehicles, and/or the like. The lighting device for vehicles may be at least one among headlights, a high beam, taillights, a brake light, a back-up light, a fog lamp, a turn signal light, and an auxiliary lamp, but is not limited thereto. Alternatively, the organic light emitting display device including the organic light emitting device according to the first to third embodiments of the present disclosure may be applied to all indicator lamps which are used to secure a field of view of a driver and transmit or receive a signal of a vehicle. Also, the organic light emitting display device according to the first to third embodiments of the present disclosure may be applied to mobile equipment, monitors, televisions (TVs), and/or the like.

The following Table 1 shows a result obtained by measuring a driving voltage, efficiency, and lifetime of an organic light emitting display device according to a comparative example and a first embodiment of the present disclosure with respect to a current density of 8 $mA/cm^2$.

TABLE 1

| Division | Driving Voltage (Volt) | Efficiency (cd/A) | Lifetime (hrs) |
|---|---|---|---|
| Comparative Example | 100% | 100% | 100% |
| First Embodiment | 100% | 105% | 120% |

In Table 1, the comparative example and the first embodiment of the present disclosure have been measured by applying the organic light emitting display device of FIG. 2.

In Table 1, the comparative example corresponds to a case where an ECL is excluded from the organic light emitting display device of FIG. 2, and the first embodiment of the present disclosure corresponds to a case to which the organic light emitting display device including the ECL illustrated FIG. 2 is applied. Also, the first embodiment of the present disclosure has been compared with the comparative example where the driving voltage, the efficiency, and the lifetime are each set to 100%.

It can be seen that in the driving voltage (Volt), the first embodiment of the present disclosure is equal to the comparative example. It can be seen that an ECL is further provided, and thus, even when a thickness of the organic light emitting display device becomes thicker, the driving voltage does not increase.

Also, it can be seen that in the efficiency (cd/A), the first embodiment of the present disclosure is enhanced by approximately 5% in comparison with the comparative example. Therefore, it can be seen that since the green EML includes an exciplex, the efficiency of the green EML is enhanced, and emission efficiency is further enhanced by the ECL.

Also, when initial emission luminance is 100%, it can be seen that for time taken until luminance is reduced by 95% (i.e., a 95% lifetime (T95) of the organic light emitting device), the first embodiment of the present disclosure is enhanced by approximately 20% in comparison with the comparative example. Accordingly, it can be seen that since the green EML includes an exciplex and an exciton is confined in the green EML by the ECL, emission efficiency is further enhanced, and thus, the lifetime is enhanced.

As described above, according to the embodiments of the present disclosure, a green EML may include three or more hosts, and by adjusting triplet energy levels of the hosts, an exciplex may be formed in the green EML to enhance emission efficiency, thereby providing an organic light emitting display device with enhanced lifetime.

Moreover, according to the embodiments of the present disclosure, a green EML may include three or more hosts, and by adjusting triplet energy levels of the hosts, exciplex may be formed in the green EML, and an exciton confinement layer may be disposed adjacent to the green EML, whereby an exciton may be confined in the green EML. Accordingly, provided is an organic light emitting display device in which emission efficiency is enhanced, consumption power is improved, and lifetime is enhanced.

Moreover, according to the embodiments of the present disclosure, a green phosphorescence EML including a mixed host and an electron host may be provided, thereby providing an organic light emitting display device in which lifetime is further enhanced than that of a green fluorescence green EML.

An organic light emitting display device in accordance with the present disclosure comprises a first pixel and a second pixel. The organic light emitting display device includes a first electrode on the first pixel and the second pixel, a hole transport layer on the first electrode, a first emission layer on the hole transport layer in correspondence with the first pixel, a second emission layer on the hole transport layer in correspondence with the second pixel, the second emission layer including a mixed host and an electron-type host, an exciton confinement layer on the first emission layer and the second emission layer, and a second electrode on the exciton confinement layer.

The second emission layer may include a green emission layer, and the mixed host and the electron-type host may constitute an exciplex.

The organic light emitting display device may further include an electron transport layer on the exciton confinement layer, wherein a triplet energy level of the first emission layer may be lower than a triplet energy level of the hole transport layer and a triplet energy level of the electron transport layer.

The mixed host may include a hole-type host and a first host, the hole-type host being disposed adjacent to the hole transport layer.

A lowest unoccupied molecular orbital (LUMO) energy level of the first host may have a level between a LUMO energy level of the hole-type host and a LUMO energy level of the electron-type host.

A bandgap of the first host may be wider than a bandgap of the electron-type host and a bandgap of the hole-type host.

A triplet energy level of the first host and a triplet energy level of the hole-type host may be 0.04 eV to 0.10 eV higher than a triplet energy level of the electron-type host.

A triplet energy level of the exciton confinement layer may be higher than a triplet energy level of the electron-type host.

A difference between a triplet energy level of the exciton confinement layer and a triplet energy level of the electron-type host may be greater than a difference between a triplet energy level of the first host and the triplet energy level of the electron-type host.

Each of the mixed host and the electron-type host may be a phosphorescent host.

The exciton confinement layer may be disposed adjacent to the electron-type host.

A triplet energy level of the second emission layer may be lower than a triplet energy level of the exciton confinement layer, and a triplet energy level of the second emission layer may be lower than a triplet energy level of the hole transport layer.

The first emission layer may be an emission layer emitting red or blue light.

An organic light emitting display device in accordance with the present disclosure comprises at least one hole transport layer, at least one emission layer, and at least one electron transport layer between an anode and a cathode, which includes an exciton confinement layer on the at least one emission layer, wherein the at least one emission layer includes a first host and an electron-type host, and when a triplet energy level of the exciton confinement layer is ECL(T1), a triplet energy level of the first host is W(T1), and a triplet energy level of the electron-type host is E(T1), ECL(T1)>W(T1)>E(T1) is satisfied.

The at least one emission layer may include a green emission layer, the green emission layer including an exciplex.

A triplet energy level of the green emission layer may be lower than a triplet energy level of the at least one hole transport layer and a triplet energy level of the at least one electron transport layer.

The at least one emission layer may further include a hole-type host, and the hole-type host and the first host may be mixed.

When a triplet energy level of the hole-type host is H(T1), H(T1)>W(T1)>E(T1) may be satisfied.

The exciton confinement layer may be disposed adjacent to the electron-type host.

A triplet energy level of the at least one emission layer may be lower than a triplet energy level of the exciton confinement layer, and the triplet energy level of the at least one emission layer may be lower than a triplet energy level of the at least one hole transport layer.

A difference between a triplet energy level of the exciton confinement layer and a triplet energy level of the electron-type host may be greater than a difference between a triplet energy level of the first host and the triplet energy level of the electron-type host.

An organic light emitting display device in accordance with the present disclosure comprises a hole transport layer on an anode and an emission layer on the hole transport layer, the emission layer including a hole-type host, an electron-type host, and a first host having a triplet energy level between a triplet energy level of the hole-type host and a triplet energy level of the electron-type host, wherein the hole-type host, the first host, and the electron-type host constitute an exciplex.

The hole-type host and the first host may be mixed, and each of the hole-type host, the electron-type host, and the first host may be a phosphorescent host.

When a triplet energy level of the hole-type host is H(T1), a triplet energy level of the first host is W(T1), and a triplet energy level of the electron-type host is E(T1), H(T1)>W(T1)>E(T1) may be satisfied.

The organic light emitting display device further includes an exciton confinement layer on the emission layer, wherein when a triplet energy level of the exciton confinement layer is ECL(T1), ECL(T1)>H(T1)>W(T1)>E(T1) may be satisfied.

When a triplet energy level of the emission layer is G(T1), a triplet energy level of the hole transport layer is HTL(T1), and a triplet energy level of the electron transport layer is ETL(T1), HTL(T1)>G(T1) and G(T1)<ETL(T1) may be satisfied.

The objects of the present disclosure are not limited to the aforesaid, but other objects not described herein will be clearly understood by those skilled in the art from descriptions below.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An organic light emitting display device including a first pixel and a second pixel adjacent to the first pixel, the organic light emitting display device comprising:
    a first electrode of the first pixel and a first electrode of the second pixel;
    a second electrode over the first electrode of the first pixel and the first electrode of the second pixel;
    a common first hole transport layer on the first electrode of the first pixel and on the first electrode of the second pixel;
    a second hole transport layer of the first pixel on the first electrode of the first pixel, wherein the second hole transport layer of the first pixel is in direct contact with the common first hole transport layer;
    a second hole transport layer of the second pixel on the first electrode of the second pixel, wherein a thickness of the second hole transport layer of the first pixel is different from a thickness of the second hole transport layer of the second pixel, and wherein the second hole transport layer of the second pixel is in direct contact with the common first hole transport layer;
    a first emission layer on the second hole transport layer of the first pixel in correspondence with the first pixel to emit a first color of light for the first pixel, the first emission layer not in correspondence with the second pixel, and the first emission layer over the first electrode of the first pixel;
    a second emission layer on the second hole transport layer of the second pixel in correspondence with the second pixel to emit a second color of light for the second pixel different from the first color, the second emission layer including a green emission layer, and including a mixed host and an electron-type host, the second emission layer not in correspondence with the first pixel, and the second emission layer over the first electrode of the second pixel, wherein the mixed host comprises a hole-type host and a first host, and wherein the mixed host and the electron-type host constitute an exciplex for energy transfer to at least one dopant in the second emission layer; and
    an exciton confinement layer on the first emission layer and the second emission layer, the exciton confinement layer below the second electrode,
    wherein a volume ratio of the hole-type host to the first host to the electron-type host in the second emission layer is one among 1:1:1, (2 to 3):1:1, 1:(2 to 3):1, 1:1:(2 to 3), (2 to 3):(2 to 3):1, (2 to 3):1:(2 to 3), and 1:(2 to 3):(2 to 3).

2. The organic light emitting display device of claim 1, further comprising an electron transport layer on the exciton confinement layer,
    wherein a triplet energy level of the second emission layer is lower than a triplet energy level of the hole transport layer and a triplet energy level of the electron transport layer.

3. The organic light emitting display device of claim 1, the hole-type host being disposed adjacent to the hole transport layer.

4. The organic light emitting display device of claim 3, wherein a lowest unoccupied molecular orbital (LUMO) energy level of the first host has a level between a LUMO energy level of the hole-type host and a LUMO energy level of the electron-type host.

5. The organic light emitting display device of claim 3, wherein a bandgap of the first host is wider than a bandgap of the electron-type host and a bandgap of the hole-type host.

6. The organic light emitting display device of claim 3, wherein a triplet energy level of the first host and a triplet energy level of the hole-type host are 0.04 eV to 0.10 eV higher than a triplet energy level of the electron-type host.

7. The organic light emitting display device of claim 3, wherein a triplet energy level of the exciton confinement layer is higher than a triplet energy level of the electron-type host.

8. The organic light emitting display device of claim 3, wherein a difference between a triplet energy level of the exciton confinement layer and a triplet energy level of the electron-type host is greater than a difference between a triplet energy level of the first host and the triplet energy level of the electron-type host.

9. The organic light emitting display device of claim 1, wherein each of the mixed host and the electron-type host is a phosphorescent host.

10. The organic light emitting display device of claim 1, wherein the exciton confinement layer is disposed adjacent to the electron-type host.

11. The organic light emitting display device of claim 1, wherein a triplet energy level of the second emission layer is lower than a triplet energy level of the exciton confinement layer, and the triplet energy level of the second emission layer is lower than a triplet energy level of the second hole transport layer of the second pixel.

12. The organic light emitting display device of claim 1, wherein the first emission layer is an emission layer emitting red light or blue light.

13. An organic light emitting display device comprising:
    a first pixel including:
        a first anode and a first part of a cathode, at least a first part of a common first hole transport layer on the first anode, a second hole transport layer of the first pixel on the first part of the common first hole transport layer, wherein the second hole transport layer of the first pixel is in direct contact with the first part of the common first hole transport layer, and a first emission layer between the first anode and the first part of the cathode to emit a first color of light for the first pixel; and a second pixel adjacent to the first pixel, the second pixel including:

a second anode and a second part of the cathode, at least a second part of the common first hole transport layer on the second anode, a second hole transport layer of the second pixel on the second part of the common first hole transport layer, wherein a thickness of the second hole transport layer of the first pixel is different from a thickness of the second hole transport layer of the second pixel, and wherein the second hole transport layer of the second pixel is in direct contact with the second part of the common first hole transport layer, a second emission layer between the second anode and the second part of the cathode, an electron transport layer, and an exciton confinement layer over the second emission layer, wherein the second emission layer comprises a green emission layer, and comprises a mixed host including a hole-type host and a first host, and an electron-type host, the second emission layer to emit a second color of light for the second pixel different from the first color, wherein the mixed host and the electron-type host constitute an exciplex for energy transfer to at least one dopant in the second emission layer, wherein the first emission layer is not in correspondence with the second pixel, and the second emission layer is not in correspondence with the first pixel, when a triplet energy level of the exciton confinement layer is ECL(T1), a triplet energy level of the first host is W(T1), and a triplet energy level of the electron-type host is E(T1), ECL(T1)>W(T1)>E(T1) is satisfied, and wherein a volume ratio of the hole-type host to the first host to the electron-type host in the second emission layer is one among 1:1:1, (2 to 3):1:1, 1:(2 to 3):1, 1:1:(2 to 3), (2 to 3):(2 to 3):1, (2 to 3):1:(2 to 3), and 1:(2 to 3):(2 to 3).

14. The organic light emitting display device of claim 13, wherein a triplet energy level of the green emission layer is lower than a triplet energy level of the second hole transport layer of the second pixel and a triplet energy level of the electron transport layer.

15. The organic light emitting display device of claim 13, wherein
the hole-type host and the first host are mixed.

16. The organic light emitting display device of claim 15, wherein when a triplet energy level of the hole-type host is H(T1), H(T1)>W(T1)>E(T1) is satisfied.

17. The organic light emitting display device of claim 13, wherein the exciton confinement layer is disposed adjacent to the electron-type host.

18. The organic light emitting display device of claim 13, wherein
a triplet energy level of the second emission layer is lower than a triplet energy level of the exciton confinement layer, and the triplet energy level of the second emission layer is lower than a triplet energy level of the second hole transport layer of the second pixel.

19. The organic light emitting display device of claim 13, wherein a difference between the triplet energy level of the exciton confinement layer and the triplet energy level of the electron-type host is greater than a difference between the triplet energy level of the first host and the triplet energy level of the electron-type host.

20. An organic light emitting display device comprising:
a first pixel including:

a first anode and a first part of a cathode, at least a first part of a common first hole transport layer on the first anode, a second hole transport layer of the first pixel on the first part of the common first hole transport layer, wherein the second hole transport layer of the first pixel is in direct contact with the first part of the common first hole transport layer, and a first emission layer between the first anode and the first part of the cathode to emit a first color of light for the first pixel; and a second pixel adjacent to the first pixel, the second pixel including:

a second anode and a second part of the cathode, at least a second part of the common first hole transport layer on the second anode, a second hole transport layer of the second pixel on the second part of the common first hole transport layer between the second anode and the second part of the cathode, wherein a thickness of the second hole transport layer of the first pixel is different from a thickness of the second hole transport layer of the second pixel, and wherein the second hole transport layer of the second pixel is in direct contact with the second part of the common first hole transport layer, and a second emission layer on the second hole transport layer of the second pixel and disposed between the second anode and the second part of the cathode to emit a second color of light for the second pixel different from the first color, the second emission layer including a green emission layer, and including a hole-type host, an electron-type host, and a first host having a triplet energy level between a triplet energy level of the hole-type host and a triplet energy level of the electron-type host, wherein the hole-type host, the first host, and the electron-type host constitute an exciplex for energy transfer to at least one dopant in the second emission layer, wherein the first emission layer is not in correspondence with the second pixel, and the second emission layer is not in correspondence with the first pixel, and wherein a volume ratio of the hole-type host to the first host to the electron-type host in the second emission layer is one among 1:1:1, (2 to 3):1:1, 1:(2 to 3):1, 1:1:(2 to 3), (2 to 3):(2 to 3):1, (2 to 3):1:(2 to 3), and 1:(2 to 3):(2 to 3).

21. The organic light emitting display device of claim 20, wherein
the hole-type host and the first host are mixed, and
each of the hole-type host, the electron-type host, and the first host is a phosphorescent host.

22. The organic light emitting display device of claim 20, wherein when the triplet energy level of the hole-type host is H(T1), the triplet energy level of the first host is W(T1), and the triplet energy level of the electron-type host is E(T1), H(T1)>W(T1)>E(T1) is satisfied.

23. The organic light emitting display device of claim 20, further comprising an exciton confinement layer on the second emission layer,
wherein when a triplet energy level of the exciton confinement layer is ECL(T1), ECL(T1)>H(T1)>W(T1)>E(T1) is satisfied.

24. The organic light emitting display device of claim 20, wherein when a triplet energy level of the second emission layer is G(T1), a triplet energy level of the second hole transport layer of the second pixel is HTL(T1), and a triplet energy level of the electron transport layer is ETL(T1), HTL(T1)>G(T1) and G(T1)<ETL(T1) are satisfied.

25. The organic light emitting display device of claim 20, wherein the second emission layer is the green emission layer to emit a green color of light.

26. The organic light emitting display device of claim 1, further comprising:
a p-type hole transport layer on the first electrode of the first pixel and on the first electrode of the second pixel, and
wherein the common first hole transport layer is on the p-type hole transport layer.

27. The organic light emitting display device of claim 13, further comprising:
a p-type hole transport layer on the first anode of the first pixel and on the second anode of the second pixel, and
wherein the common first hole transport layer is on the p-type hole transport layer.

28. The organic light emitting display device of claim 20, further comprising:
a p-type hole transport layer on the first anode of the first pixel and on the second anode of the second pixel, and
wherein the common first hole transport layer is on the p-type hole transport layer.

29. An organic light emitting display device including a first pixel and a second pixel adjacent to the first pixel, the organic light emitting display device comprising:
a first electrode of the first pixel and a first electrode of the second pixel;
a second electrode over the first electrode of the first pixel and the first electrode of the second pixel;
a common first hole transport layer on the first electrode of the first pixel and on the first electrode of the second pixel;
a second hole transport layer of the first pixel on the first electrode of the first pixel, wherein the second hole transport layer of the first pixel is in direct contact with the common first hole transport layer;
a second hole transport layer of the second pixel on the first electrode of the second pixel, wherein a thickness of the second hole transport layer of the first pixel is different from a thickness of the second hole transport layer of the second pixel, and wherein the second hole transport layer of the second pixel is in direct contact with the common first hole transport layer;
a first emission layer on the second hole transport layer of the first pixel in correspondence with the first pixel to emit a first color of light for the first pixel, the first emission layer not in correspondence with the second pixel, and the first emission layer over the first electrode of the first pixel;
a second emission layer on the second hole transport layer of the second pixel in correspondence with the second pixel to emit a second color of light for the second pixel different from the first color, the second emission layer including a green emission layer, and including a first host, a hole type host, and an electron-type host, the second emission layer not in correspondence with the first pixel, and the second emission layer over the first electrode of the second pixel, and wherein the first host, the hole-type host, and the electron-type host constitute an exciplex for energy transfer to at least one dopant in the second emission layer; and
an exciton confinement layer on the first emission layer and the second emission layer, the exciton confinement layer below the second electrode,
wherein a volume ratio of the hole-type host to the first host to the electron-type host in the second emission layer is one among 1:1:1, (2 to 3):1:1, 1:(2 to 3):1, 1:1:(2 to 3), (2 to 3):(2 to 3):1, (2 to 3):1:(2 to 3), and 1:(2 to 3):(2 to 3).

30. The organic light emitting display device of claim 29, wherein the electron-type host is adjacent to the exciton confinement layer.

* * * * *